(12) United States Patent
Shibuta et al.

(10) Patent No.: US 9,341,959 B2
(45) Date of Patent: May 17, 2016

(54) SUBSTRATE HOLDING DEVICE, EXPOSURE APPARATUS, AND DEVICE MANUFACTURING METHOD

(75) Inventors: Makoto Shibuta, Kumagaya (JP);
Yuichi Yoshida, Kumagaya (JP);
Hiroaki Takaiwa, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 83 days.

(21) Appl. No.: 13/334,773

(22) Filed: Dec. 22, 2011

(65) Prior Publication Data

US 2012/0094238 A1    Apr. 19, 2012

Related U.S. Application Data

(62) Division of application No. 11/575,392, filed as application No. PCT/JP2005/017173 on Sep. 16, 2005, now Pat. No. 8,102,512.

(30) Foreign Application Priority Data

Sep. 17, 2004  (JP) ................ P2004-271634

(51) Int. Cl.
*G03B 27/52* (2006.01)
*G03B 27/58* (2006.01)
(Continued)

(52) U.S. Cl.
CPC ............ *G03F 7/70341* (2013.01); *G03F 7/707* (2013.01); *H01L 21/6715* (2013.01);
(Continued)

(58) Field of Classification Search
CPC . G03F 7/20341; G03F 7/70341; G03F 7/707; G03F 7/70858; G03F 7/70875; G03F 7/70908;
G03F 7/70916; G03F 7/7095; H01L 21/6715; H01L 21/6838; H01L 21/68735; H01L 21/6875; Y10T 29/49002
USPC ........... 355/30, 52, 53, 55, 67–71, 72–74, 77; 430/5, 8, 22, 30, 311, 312; 250/492.1, 250/492.2, 492.22, 548
See application file for complete search history.

(56) References Cited

U.S. PATENT DOCUMENTS 4,346,164 A    8/1982  Tabarelli et al.
4,480,910 A   11/1984  Takanashi et al.
(Continued)

FOREIGN PATENT DOCUMENTS

DE    221 563    9/1983
DE    224 448    7/1985
(Continued)

OTHER PUBLICATIONS

European Patent Office Action mailed Oct. 26, 2012 for corresponding European Patent Application No. 05783614.0.
(Continued)

*Primary Examiner* — Christina Riddle

(57) ABSTRACT

To provide a substrate holding apparatus which can prevent a liquid from entering into a rear surface side of a substrate. A substrate holding apparatus is provided with a base material, a first holding portion formed on the base material for holding the substrate, and a second holding portion formed on the base material for holding a plate member by surrounding the circumference of a processing substrate held by the first holding portion. The second holding portion holds the plate member so as to form a second space on the side of the rear surface of the plate member. On the rear surface of the plate member, an absorbing member is arranged for absorbing the liquid entered from a gap between the substrate held by the first holding portion and the plate member held by the second holding portion.

17 Claims, 19 Drawing Sheets

(51) Int. Cl.
  *G03B 27/60* (2006.01)
  *G03F 7/20* (2006.01)
  *H01L 21/67* (2006.01)
  *H01L 21/683* (2006.01)
  *H01L 21/687* (2006.01)

(52) U.S. Cl.
  CPC ........ *H01L21/6838* (2013.01); *H01L 21/6875* (2013.01); *H01L 21/68735* (2013.01); *Y10T 29/49002* (2015.01)

(56) References Cited

U.S. PATENT DOCUMENTS

| | | | |
|---|---|---|---|
| 4,655,594 A | 4/1987 | Wittekoek et al. | |
| 5,194,893 A | 3/1993 | Nishi | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,839,324 A | 11/1998 | Hara | |
| 5,874,820 A | 2/1999 | Lee | |
| 5,969,441 A | 10/1999 | Loopstra et al. | |
| 7,199,858 B2 | 4/2007 | Lof et al. | |
| 2004/0075895 A1 | 4/2004 | Lin | |
| 2004/0160582 A1 | 8/2004 | Lof et al. | |
| 2004/0165159 A1 | 8/2004 | Lof et al. | |
| 2005/0073670 A1 | 4/2005 | Carroll | |
| 2005/0122505 A1 | 6/2005 | Miyajima | |
| 2005/0219488 A1* | 10/2005 | Nei et al. | 355/53 |
| 2005/0233081 A1 | 10/2005 | Tokita | |
| 2005/0264778 A1 | 12/2005 | Lof et al. | |
| 2006/0077367 A1* | 4/2006 | Kobayashi et al. | 355/53 |
| 2006/0139594 A1* | 6/2006 | Hara et al. | 355/53 |
| 2006/0139614 A1 | 6/2006 | Owa et al. | |
| 2007/0146663 A1 | 6/2007 | Nagasaka | |
| 2007/0229787 A1* | 10/2007 | Emoto | 355/53 |
| 2007/0273856 A1 | 11/2007 | Margeson | |
| 2008/0002163 A1 | 1/2008 | Fujiwara et al. | |

FOREIGN PATENT DOCUMENTS

| | | | |
|---|---|---|---|
| EP | 1420298 | 5/2004 | |
| EP | 1 429 188 | 6/2004 | |
| EP | 1 571 695 | 9/2005 | |
| EP | 1641028 | 3/2006 | |
| EP | 1 699 072 | 9/2006 | |
| EP | 1 699 073 | 9/2006 | |
| EP | 1788617 | 5/2007 | |
| JP | 57-117238 | 7/1982 | |
| JP | 58-202448 | 11/1983 | |
| JP | 59-19912 | 2/1984 | |
| JP | 59-101835 | 6/1984 | |
| JP | 62-65326 | 3/1987 | |
| JP | 63-157419 | 6/1988 | |
| JP | 4-277612 | 10/1992 | |
| JP | 4-305915 | 10/1992 | |
| JP | 4-305917 | 10/1992 | |
| JP | 5-62877 | 3/1993 | |
| JP | 6-53120 | 2/1994 | |
| JP | 6-124873 | 5/1994 | |
| JP | 6-188169 | 7/1994 | |
| JP | 7-220990 | 8/1995 | |
| JP | 8-37149 | 2/1996 | |
| JP | 8-166475 | 6/1996 | |
| JP | 8-316125 | 11/1996 | |
| JP | 8-330224 | 12/1996 | |
| JP | 9-5463 | 1/1997 | |
| JP | 10-163099 | 6/1998 | |
| JP | 10-214783 | 8/1998 | |
| JP | 10-303114 | 11/1998 | |
| JP | 10-340846 | 12/1998 | |
| JP | 11-135400 | 5/1999 | |
| JP | 11-176727 | 7/1999 | |
| JP | 2000-58436 | 2/2000 | |
| JP | 2000-505958 | 5/2000 | |
| JP | 2001-345245 | 12/2001 | |
| JP | 2004-289127 | 10/2004 | |
| JP | 2004-363619 | 12/2004 | |
| JP | 2005-191557 | 7/2005 | |
| JP | 2005-259870 | 9/2005 | |
| WO | WO 99/49504 | 9/1999 | |
| WO | WO 2004/019128 | 3/2004 | |
| WO | WO 2004/053953 | 6/2004 | |
| WO | WO 2004053953 | 6/2004 | |
| WO | WO 2004053953 A1 * | 6/2004 | |
| WO | WO 2004/092833 | 10/2004 | |
| WO | WO 2004/093160 | 10/2004 | |
| WO | WO 2004/112108 | 12/2004 | |
| WO | WO 2004105107 | 12/2004 | |
| WO | WO 2004105107 A1 * | 12/2004 | ............ H01L 21/027 |
| WO | WO 2005/010611 | 2/2005 | |
| WO | WO 2005022616 | 3/2005 | |
| WO | WO 2005/055296 | 6/2005 | |
| WO | WO 2005/057636 | 6/2005 | |
| WO | WO 2005/059977 | 6/2005 | |
| WO | WO 2005/122219 | 12/2005 | |
| WO | WO 2006/030908 | 3/2006 | |

OTHER PUBLICATIONS

European Patent Office Action mailed Apr. 13, 2011 for corresponding European Patent Application No. 05783614.0.
European Patent Office Search Report mailed Apr. 14, 2011 for corresponding European Patent Application No. 11158026.2.
European Search Report issued on Nov. 6, 2008 for corresponding European Patent Application No. 05783614.0.
Office Action issued on Mar. 4, 2009 for corresponding European Patent Application No. 05783614.0.
Notice of Allowance issued on May 22, 2008 for corresponding Singapore Patent Application No. 200702001-9.
International Search Report issued on Dec. 27, 2005 for corresponding International Application No. PCT/JP2005/017173.
Written Opinion issued on Dec. 27, 2005 for corresponding International Application No. PCT/JP2005/017173.
Notice of Allowance issued on Sep. 28, 2010 for corresponding Japanese Patent Application No. 2006-535229.
Office Action mailed Dec. 22, 2011 in U.S. Appl. No. 11/575,392.
Office Action mailed Nov. 7, 2011 in U.S. Appl. No. 11/575,392.
Notice of Allowance mailed Sep. 19, 2011 in U.S. Appl. No. 11/575,392.
Office Action mailed Dec. 27, 2010 in U.S. Appl. No. 11/575,392.
Office Action mailed Mar. 26, 2010 in U.S. Appl. No. 11/575,392.
Office Action mailed Sep. 30, 2009 in U.S. Appl. No. 11/575,392.
Office Action mailed May 29, 2009 in U.S. Appl. No. 11/575,392.
ISA International Search Report, mailed Dec. 28, 2005 and issued in corresponding International Patent Application No. PCT/JP2005/017173.
European Office Action mailed Sep. 6, 2013 in corresponding European Application No. 05783614.0.

* cited by examiner

SUBSTRATE HOLDING DEVICE, EXPOSURE APPARATUS, AND DEVICE MANUFACTURING METHOD

CROSS-REFERENCE TO RELATED APPLICATIONS

This application is a divisional of U.S. Ser. No. 11/575,392, filed Mar. 15, 2007, now U.S. Pat. No. 8,102,512 which is based on PCT Application No. PCT/JP2005/017173 filed Sep. 16, 2005, and Japanese Application No. 2004-271634 filed on Sep. 17, 2004, the disclosures of which are hereby incorporated herein by reference.

TECHNICAL FIELD

The present invention relates to a substrate holding device that holds a substrate to be processed, an exposure apparatus that exposes a substrate to be processed, and a device manufacturing method.

The present invention claims priority to Japanese Patent Application No. 2004-271634, filed on Sep. 17, 2004, and its content is incorporated herein by reference.

BACKGROUND ART

In the photolithography process, which is one of the processes for manufacturing micro-devices such as semiconductor devices or liquid crystal display devices, an exposure apparatus that projection-exposes a pattern formed on a mask onto a photosensitive substrate is used. Such an exposure apparatus has a mask stage that supports a mask and a substrate stage that supports a substrate and, while successively moving the mask stage and the substrate stage, exposes the pattern of the mask onto the substrate via a projection optical system. In manufacturing micro-devices, miniaturization of the pattern formed on a substrate is required in order to make such micro-devices high-density ones. To address this requirement, it is desired that the exposure apparatus have a still higher resolution; as a means for realizing such a still higher resolution, such a liquid immersion exposure apparatus as disclosed in the patent document 1, below, in which exposure processes are performed in a state that the space between a projection optical system and a substrate is filled with a liquid having a higher refractive index compared with gases, has been devised.

Patent Document 1: PCT International Publication WO 99/49504.

DISCLOSURE OF INVENTION

Problems to be Solved by the Invention

By the way, in the case where, as shown in FIG. 19, a peripheral area (edge area) E of a substrate (substrate to be processed) P is liquid-immersion exposed, there arises the case where a portion of liquid immersion region AR2' covering projection area AR1' of the projection optical system is formed outside the substrate P. In such a case where the edge area E of the substrate P is exposed in a state that a portion of the liquid immersion region AR2' is formed outside the substrate P, there arises a possibility that the liquid finds its way over to the rear surface side of the substrate via, e.g., the gap (clearance) between the substrate and the substrate stage and penetrates into the space between the substrate and the substrate stage (substrate holder). In that case, there arises a possibility that the substrate stage cannot hold the substrate well. For example, since the liquid having penetrated into the space between the substrate and the substrate stage acts as a foreign material, there arises a possibility that deterioration of the flatness of the supported substrate is induced. Further, with the liquid having penetrated evaporating, an adhesion trace (hereinafter, referred to as water mark even when the liquid is not water) may be formed. Since the water mark also acts as a foreign material, there arises the possibility that deterioration of the flatness of the supported substrate is induced. Still further, there may also arises disadvantages, e.g., the disadvantage that the substrate stage is thermally deformed by the evaporation heat generated when the liquid having penetrated into the space between the substrate and the substrate stage evaporates.

The purpose of some aspects of the invention is to provide a substrate holding device and an exposure apparatus that are capable of preventing a liquid from penetrating toward the rear surface side of a substrate and a device manufacturing method using such exposure apparatus.

Means for Solving the Problem

To resolve the above-described problems, the present invention adopts the following configurations that are illustrated in the embodiments and correspond to FIGS. 1-18. It is to be noted that the parenthesized letter or numeral attached to each constituent element only exemplifies such element and does not limit its scope.

In accordance with a first aspect of the present invention, there is provided a substrate holding device for holding a substrate to be processed which is to be exposed via a liquid, comprising: a base member, a first holding portion that is formed on the base member and holds the substrate to be processed, and a second holding portion that is formed on the base member and holds a plate member so as to surround the circumference of the substrate to be processed held by the first holding portion, wherein the second holding portion holds the plate member so that a space is formed on the rear surface side of the plate member, and wherein on the rear surface of the plate member T is disposed an absorbing member that absorbs a liquid having penetrated through a gap between the substrate to be processed held by the first holding portion and the plate member held by the second holding portion.

In accordance with the first aspect of the present invention, since the liquid having penetrated through the gap between the substrate to be processed and the plate member is absorbed by the absorbing member, the liquid's penetration into the rear surface side space of the substrate to be processed can be prevented. Thus, the substrate holding device can hold well the substrate to be processed.

In accordance with a second aspect of the present invention, there is provided a substrate holding device for holding a substrate to be processed which is to be exposed via a liquid, comprising: a base member, a first holding portion that is formed on the base member and holds the substrate to be processed, and a second holding portion that is formed on the base member and holds a plate member so as to surround the circumference of the substrate to be processed held by the first holding portion, wherein on a side surface of the plate member which side surface faces an object is provided a recovery port that recovers the liquid.

In accordance with the second aspect of the present invention, since the liquid having penetrated through a gap between the object such as the substrate to be processed and the plate member is recovered via the recovery port provided on the side surface of the plate member, which side surface faces the object, the liquid's penetration into the rear surface side space of the object can be prevented. Thus, the substrate holding device can hold the object well.

In accordance with a third aspect of the present invention, there is provided a substrate holding device for holding a substrate to be processed which is to be exposed via a liquid, comprising: a base member, a first holding portion that is formed on the base member and holds the substrate to be processed, and a second holding portion that is formed on the base member and holds a plate member so as to surround the circumference of the substrate to be processed held by the first holding portion, wherein the first holding portion has a first supporting portion, having a protruding shape, that supports the rear surface of the substrate to be processed and a first peripheral wall portion that is formed so as to face the rear surface of the substrate to be processed and surround the first supporting portion, and wherein an upper surface of the first peripheral wall portion which faces the rear surface of the substrate to be processed is applied with a surface roughening treatment.

In accordance with the third aspect of the present invention, since the first peripheral wall's upper surface applied with the surface roughening treatment prevents the movement of the liquid, penetration of the liquid into the rear surface side space of the substrate to be processed via a space between the rear surface of the substrate to be processed and the first peripheral wall's upper surface can be prevented. Thus, the substrate holding device can hold well the substrate to be processed.

In accordance with a fourth aspect of the present invention, there is provided a substrate holding device for holding a substrate to be processed which is to be exposed via a liquid, comprising: a base member, a first holding portion that is formed on the base member and holds the substrate to be processed, and a second holding portion that is formed on the base member and holds a plate member so as to surround the circumference of the substrate to be processed held by the first holding portion, wherein the first holding portion has a first supporting portion, having a protruding shape, that supports the rear surface of the substrate to be processed and a first peripheral wall portion that is formed so as to face the rear surface of the substrate to be processed and surround the first supporting portion, and wherein outside the first peripheral wall portion is provided a liquid-repellent member having a liquid-repellency relative to the liquid.

In accordance with the fourth aspect of the present invention, since the liquid having penetrated through a gap between the substrate to be processed and the plate member is repelled by the liquid-repellent member provided outside the first peripheral wall portion, the liquid's penetration into the rear surface side space of the substrate to be processed can be prevented. Thus, the substrate holding device can hold well the substrate to be processed.

In accordance with a fifth aspect of the present invention, there is provided a substrate holding device for holding a substrate to be processed which is to be exposed via a liquid, comprising: a base member, a first holding portion that is formed on the base member and holds the substrate to be processed, and a second holding portion that is formed on the base member and holds a plate member so as to surround the circumference of the substrate to be processed held by the first holding portion, wherein the first holding portion has a first supporting portion, having a protruding shape, that supports the rear surface of the substrate to be processed and a first peripheral wall portion that is formed so as to face the rear surface of the substrate to be processed and surround the first supporting portion, and wherein outside the first peripheral wall portion is provided a porous member that retains the liquid having penetrated through a gap between substrate to be processed held by the first holding portion and the plate member held by the second holding portion.

In accordance with the fifth aspect of the present invention, since the liquid having penetrated through the gap between the substrate to be processed and the plate member is absorbed by the porous member disposed outside the first peripheral wall portion holding the substrate to be processed, the liquid's penetration into the rear surface side space of the substrate to be processed can be prevented. Thus, the substrate holding device can hold well the substrate to be processed.

In accordance with a sixth aspect of the present invention, there is provided a substrate holding device for holding a substrate to be processed which is to be exposed via a liquid, comprising: a base member, a first holding portion that is formed on the base member and holds the substrate to be processed, and a second holding portion that is formed on the base member and holds a plate member so as to surround the circumference of the substrate to be processed held by the first holding portion, wherein the first holding portion has a first supporting portion, having a protruding shape, that supports the rear surface of the substrate to be processed and a first peripheral wall portion that is formed so as to face the rear surface of the substrate to be processed and surround the first supporting portion, and wherein at least a portion of the first peripheral wall portion is formed by a porous body.

In accordance with the sixth aspect of the present invention, since the liquid having penetrated through a gap between the substrate to be processed and the plate member is retained by the porous body forming a portion of the first peripheral wall portion, the liquid's penetration into the rear surface side space of the substrate to be processed can be prevented. Further, it may also be configured such that the liquid having penetrated is sucked and recovered via the porous body or such that by blowing out a gas via the porous body, the liquid is prevented from penetrating into the rear surface side space of the substrate to be processed. Thus, the substrate holding device can hold well the substrate to be processed.

In accordance with a seventh aspect of the present invention, there is provided a substrate holding device for holding a substrate to be processed exposed via a liquid, comprising: a base member, a first holding portion that is formed on the base member and holds the substrate to be processed, and a second holding portion that is formed on the base member and holds a plate member so as to surround the circumference of the substrate to be processed held by the first holding portion, wherein the first holding portion has a first supporting portion, having a protruding shape, that supports the rear surface of the substrate to be processed and a first peripheral wall portion that is formed so as to face the rear surface of the substrate to be processed and surround the first supporting portion, and wherein a gas supply mechanism that blows out a gas from at least a portion of the first peripheral wall portion is provided.

In accordance with the seventh aspect of the present invention, with the gas supply mechanism blowing out a gas, it can be prevented that the liquid having penetrated through a gap between the substrate to be processed and the plate member penetrates into the rear surface side space of the substrate to be processed. Thus, the substrate holding device can hold well the substrate to be processed.

In accordance with an eighth aspect of the present invention, there is provided an exposure apparatus that is provided with a substrate holding device of any of the above-described aspects and exposes, via a liquid, a substrate to be processed held by the substrate holding device.

In accordance with the eighth aspect of the present invention, the substrate to be processed can be exposed with high accuracy in a state that the substrate to be processed is held well by the substrate holding device.

In accordance with a ninth aspect of the present invention, there is provided a device manufacturing method that uses an exposure apparatus of the above-described aspect.

In accordance with the ninth aspect of the present invention, with a substrate to be processed being exposed with high accuracy, a device having a desired performance can be provided.

Effects of the Invention

In accordance with the present invention, a substrate to be processed can be exposed well in a state that penetration of a liquid into the rear surface side space of the substrate is prevented.

BEST MODE FOR CARRYING OUT THE INVENTION

Figure 1:
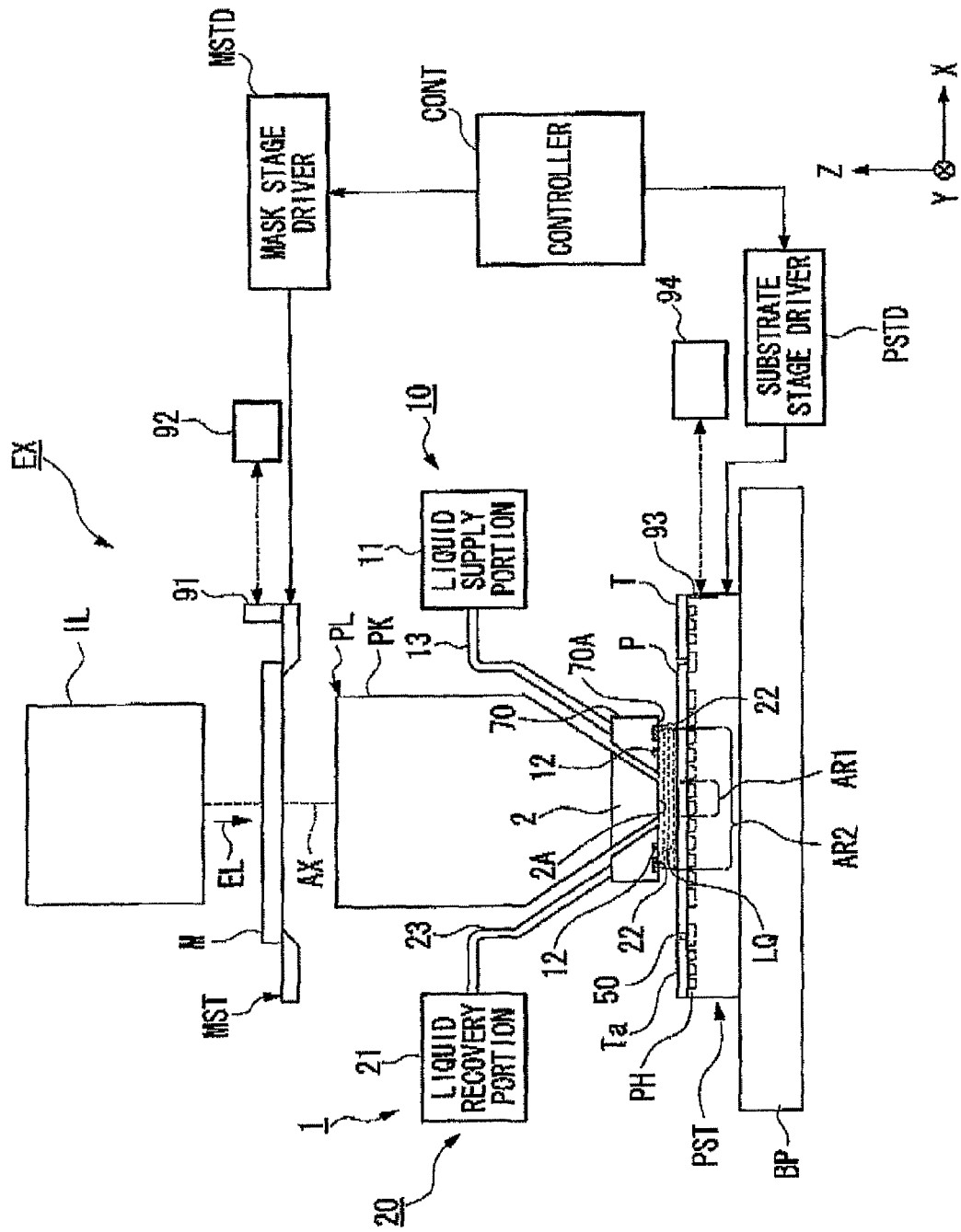
FIG. 1 is a schematic diagram showing an exposure apparatus of a first embodiment of the present invention.

In the following, an exposure apparatus embodiment of the present invention will be described referring to the drawings, but the present invention is not limited to the embodiment.

Here, in the following description, an XYZ orthogonal coordinate system will be set, and the description will be made referring to the XYZ orthogonal coordinate system. And, it is assumed that the direction that coincides with optical axis AX of projection optical system PL (vertical direction) is referred to as the Z-axis direction, that a predetermined direction in a plane perpendicular to the Z-axis direction is referred to as the X-axis direction, the direction perpendicular to the Z-axis direction and the X-axis direction is referred to as the Y-axis direction, and that the rotation (inclination) direction around the X-axis, the rotation (inclination) direction around the Y-axis, and the rotation (inclination) direction around the Z-axis are respectively referred to as the θX-direction, the θY-direction, and the θZ-direction.

FIG. 1 is a schematic diagram showing a first exposure apparatus embodiment relating to the present invention. In FIG. 1, exposure apparatus EX is provided with mask stage MST that is movable while supporting mask M, with substrate stage PST that has substrate holder (substrate holding device) PH which holds substrate P and that can move substrate P held by substrate holder PH, with illumination optical system IL that illuminates mask M supported by mask stage MST with exposure light EL, with projection optical system PL that projects a pattern image of mask M illuminated with exposure light EL onto substrate P supported by substrate stage PST, and with controller CONT that controls the overall operation of exposure apparatus EX. It should be noted that a "substrate" referred to herein is a substrate to be processed to which various kinds of processes, including an exposure process, are applied and comprehends a semiconductor wafer over which photoresist, a photosensitive material, is applied. Further, a "mask" comprehends a reticle on which a device pattern to be reduction-projected onto the substrate is formed.

Exposure apparatus EX of this embodiment is a liquid immersion exposure apparatus to which a liquid immersion method is applied, with the exposure wavelength being shortened in effect, to improve the resolution and, at the same time, to widen the depth of focus and is provided with liquid immersion mechanism 1 for forming, between projection optical system PL and substrate P, liquid immersion region AR2 of liquid LQ. Liquid immersion mechanism 1 is provided with liquid supply mechanism 10 that supplies liquid LQ onto substrate P and with liquid recovery mechanism 20 that recovers liquid LQ on substrate P. Further, in the vicinity of the end portion of projection optical system PL disposed nozzle member 70 which constitutes a portion of liquid immersion mechanism 1. Nozzle member 70 is a ring-shaped member that is disposed so as to surround optical element 2 located at the end portion of projection optical system PL on the image plane side and is provided with supply port 12 for supplying liquid LQ onto substrate P and with recovery port 22 for recovering liquid LQ. Further, in this embodiment, purified water or pure water is used as liquid LQ.

Exposure apparatus EX, at least while transferring the pattern image of mask M onto substrate P, locally forms liquid immersion area AR2 on at least a portion of substrate P so as to include projection area AR1 of projection optical system PL. Liquid immersion region AR2 is larger than projection area AR1 and is smaller than substrate P with liquid LQ having been supplied from liquid supply mechanism 10. More specifically, exposure apparatus EX, by filling with liquid LQ the space between optical element 2 located at the end portion of the projection optical system PL on the image plane side and the surface (exposure surface) of substrate P and by projecting, via this liquid LQ between projection optical system PL and substrate P, the pattern image of mask M onto substrate P held by substrate holder PH, exposes substrate P.

Illumination optical system IL is for illuminating mask M supported by mask stage MST with exposure light EL and is provided with an exposure light source that emits exposure light EL, an optical integrator that uniforms the illuminance of exposure light EL emitted from the exposure light source, a condenser lens that condenses exposure light EL from the optical integrator, a relay lens system, a field stop that sets an illumination area formed by exposure light EL on mask M, etc. A specified illumination area on mask M is illuminated, by illumination optical system IL, with exposure light EL having a uniform illuminance distribution. As exposure light EL emitted from illumination optical system IL, for example, a bright line (g-line, h-line, i-line) emitted from a mercury lamp, a deep ultraviolet light (DUV light) such as a KrF excimer laser light (wavelength of 248 nm), or a vacuum ultraviolet light (VUV light) such as an ArF excimer laser light (wavelength of 193 nm) or an $F_2$ excimer laser light (wavelength of 157 nm) may be used. In the embodiment, an ArF excimer laser light is used. As described above, liquid LQ in the embodiment is purified water and can transmit exposure light EL even when it is an ArF excimer laser light. Further, purified water can transmit a bright line in the ultraviolet region (g-line, h-line, or i-line) and a deep ultraviolet light (DUV light) such as a KrF excimer laser light (wavelength of 248 nm).

Mask stage MST is, while holding mask M, movable and fixes mask M by means of e.g., vacuum suction (or electrostatic suction). Mask stage MST is two-dimensionally movable in a plane perpendicular to optical axis AX, i.e., in the XY-plane, and is finely rotatable in the θZ-direction. On mask stage MST is set moving mirror 91 for laser interferometer 92, and the two-dimensional (XY-direction) position and the rotation angle in the θZ-direction (including the rotation angles in the θX- and θY-directions in some cases) of mask M on mask stage MST are measured by laser interferometer 92 in real time. By driving mask stage driver MSTD that includes a linear motor etc. based on the measurement results from laser interferometer 92, controller CONT controls the position of mask M supported by mask stage MST.

Projection optical system PL is for projecting the pattern of mask M onto substrate P at a predetermined projection magnification of β. Projection optical system PL is constituted by a plurality of optical elements including optical element 2 disposed at the end portion on the side of substrate P, and these optical elements are supported by lens barrel PK. In the embodiment, projection optical system PL is a reduction system of which projection magnification β is, e.g., ¼, ⅕, or ⅛. It should be noted that projection optical system PL may also be either a unit magnification system or a magnifying system. In addition, liquid LQ of liquid immersion region AR2 comes into contact with optical element 2, which is located at the end portion of projection optical system PL.

Substrate stage PST is provided with substrate holder PH that sucks and holds substrate P and with plate member T held by substrate holder PH. Substrate stage PST, on base BP, is two-dimensionally movable in the XY-plane and is finely rotatable in the θZ-direction. Further, substrate stage PST is also movable in the Z-axis-direction, in the θX-direction, and in the θY-direction. In other words, substrate P held by substrate holder PH is movable in the Z-axis-direction, in the θX- and θY-directions (inclination directions), in the two-dimensional direction (XY-direction), and in the θZ-direction. On the side face of substrate stage PST is provided moving mirror 93 for laser interferometer 94, and the two-dimensional position and the rotation angle in the θZ-direction of substrate holder PH (substrate stage PST) are measured by laser interferometer 94 in real time. Further, although not shown, exposure apparatus EX is provided with such a focus-leveling detection system as disclosed in, e.g., Japanese Unexamined Patent Application, Publication No. H08-37149 that detects the position information of the surface of substrate P held by substrate holder PH of substrate stage PST. The focus-leveling detection system detects the position information in the Z-axis-direction of the surface of substrate P and the inclination information in the θX- and θY-directions of substrate P. By driving, via substrate stage driver PSTD, substrate stage PST based upon measurement results from laser interferometer 94 and detection results from the focus-leveling detection system, controller CONT controls the position in the Z-axis-direction (focus position), the position in the inclination directions, the position in the XY-direction, and the position in the θZ-direction of substrate P held by substrate holder PH. Note that the movement mechanism of substrate stage PST is disclosed in, e.g., Japanese Unexamined Patent Application, Publication No. H09-5463 and Japanese Unexamined Patent Application, Publication No. S59-101835.

Liquid supply mechanism 10 is for supplying liquid LQ to the image plane side space of projection optical system PL and is provided with liquid supply portion 11 capable of delivering liquid LQ and with supply pipe 13 of which one end portion is connected to liquid supply portion 11. The other end portion of supply pipe 13 is connected to nozzle member 70. Liquid supply portion 11 is provided with a tank that stores liquid LQ, a pressurizing pump, a filter unit that removes foreign particles and air bubbles included in liquid LQ, etc.

Liquid recovery mechanism 20 is for recovering liquid LQ existing on the image plane side of projection optical system PL and is provided with liquid recovery portion 21 capable of recovering liquid LQ and with recovery pipe 23 of which one end is connected to liquid recovery portion 21. The other end of recovery pipe 23 is connected to nozzle member 70. Liquid recovery portion 21 is provided with a vacuum system (suction device), e.g., a vacuum pump, a gas-liquid separator that separates the recovered liquid LQ from gas, a tank that stores the recovered liquid LQ, etc. It should be noted that as the vacuum system, a vacuum system of a factory in which exposure apparatus EX is installed may be used, without exposure apparatus EX being provided with a vacuum system.

Nozzle member 70 is a ring-shaped member that is provided so as to surround, above substrate P (substrate stage PST), the side face of optical element 2. Between nozzle member 70 and optical element 2 is provided a clearance, and nozzle member 70 is supported by a certain supporting mechanism so as to be vibrationally isolated from optical element 2. In nozzle member 70's undersurface 70A that faces substrate P is provided with supply port 12 that supplies liquid LQ onto substrate P. Further, inside nozzle member 70 is formed a supply flow path through which liquid LQ to be supplied onto substrate P flows. One end portion of the supply flow path of nozzle member 70 is connected to the other end portion of supply pipe 13, and the other end portion of the supply flow path is connected to supply port 12.

Further, in undersurface 70A of nozzle member 70 is provided with recovery port 22 that recovers liquid LQ on substrate P. In the embodiment, recovery port 22 is provided, in undersurface 70A of nozzle member 70, in a ring-shaped manner so as to surround optical element 2 (projection area AR1) of projection optical system PL and supply port 12. Further, inside nozzle member 70 is formed a recovery flow path through which liquid LQ having been recovered via recovery port 22 flows. One end portion of the recovery flow path of nozzle member 70 is connected to the other end portion of recovery pipe 23, and the other end portion of the recovery flow path is connected to recovery port 22.

The operation of liquid supply portion 11 is controlled by controller CONT. When supplying liquid LQ onto substrate P, controller CONT delivers liquid LQ from liquid supply portion 11 and supplies liquid LQ of a predetermined per-unit-time amount onto substrate P from supply ports 12 provided above substrate P via supply pipe 13 and the supply flow path formed inside nozzle member 70. Further, the operation of liquid recovery portion 21 is also controlled by controller CONT. Controller CONT can control the per-unit-time liquid recovery amount by liquid recovery portion 21. Liquid LQ that has been recovered from substrate P via recovery port 22 provided above substrate P is recovered by and into liquid recovery portion 21 via the recovery flow path formed inside nozzle member 70 and recovery pipe 23.

Figure 2:
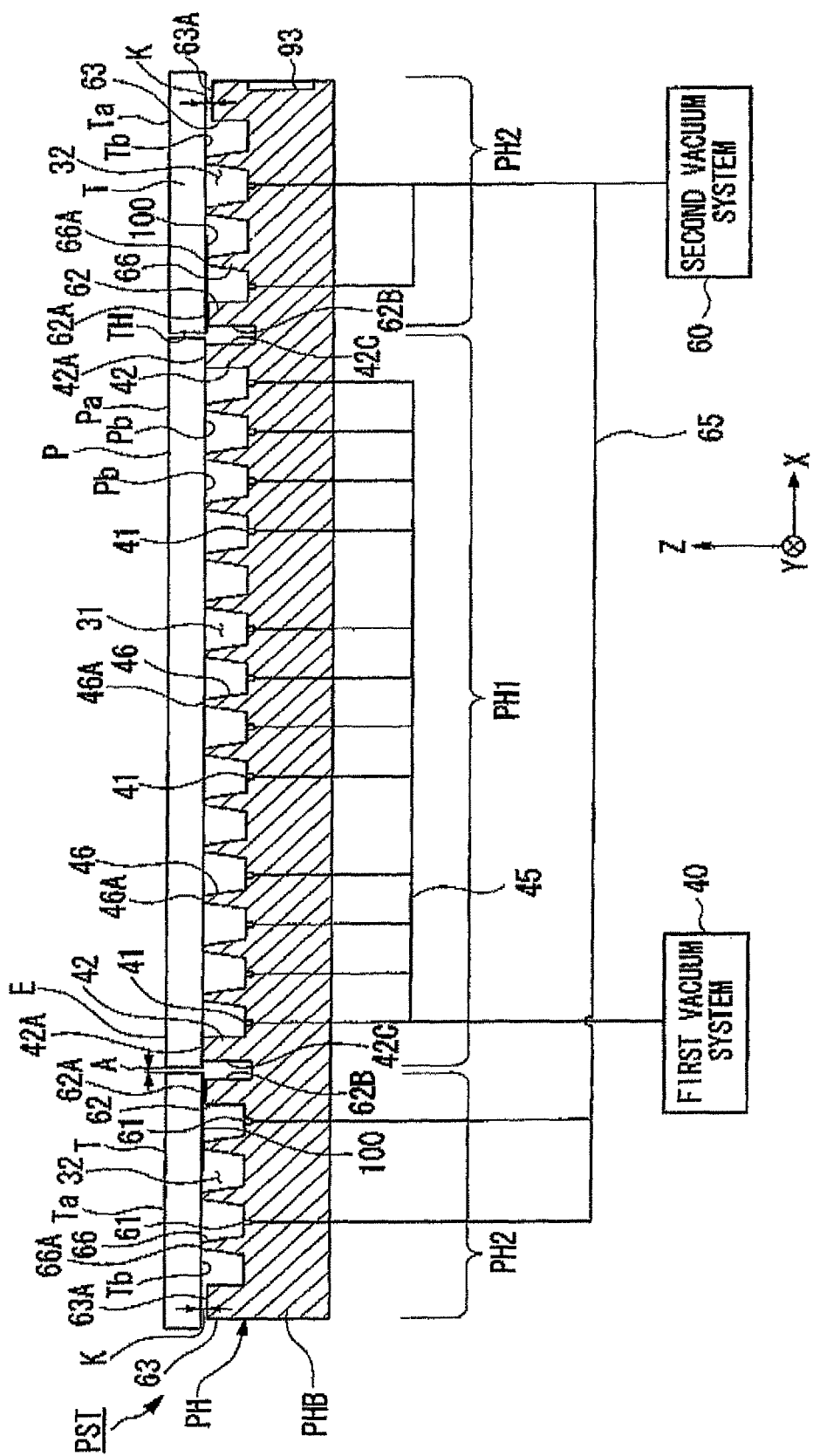
FIG. 2 is a sectional side view showing a substrate holder.
Figure 3:
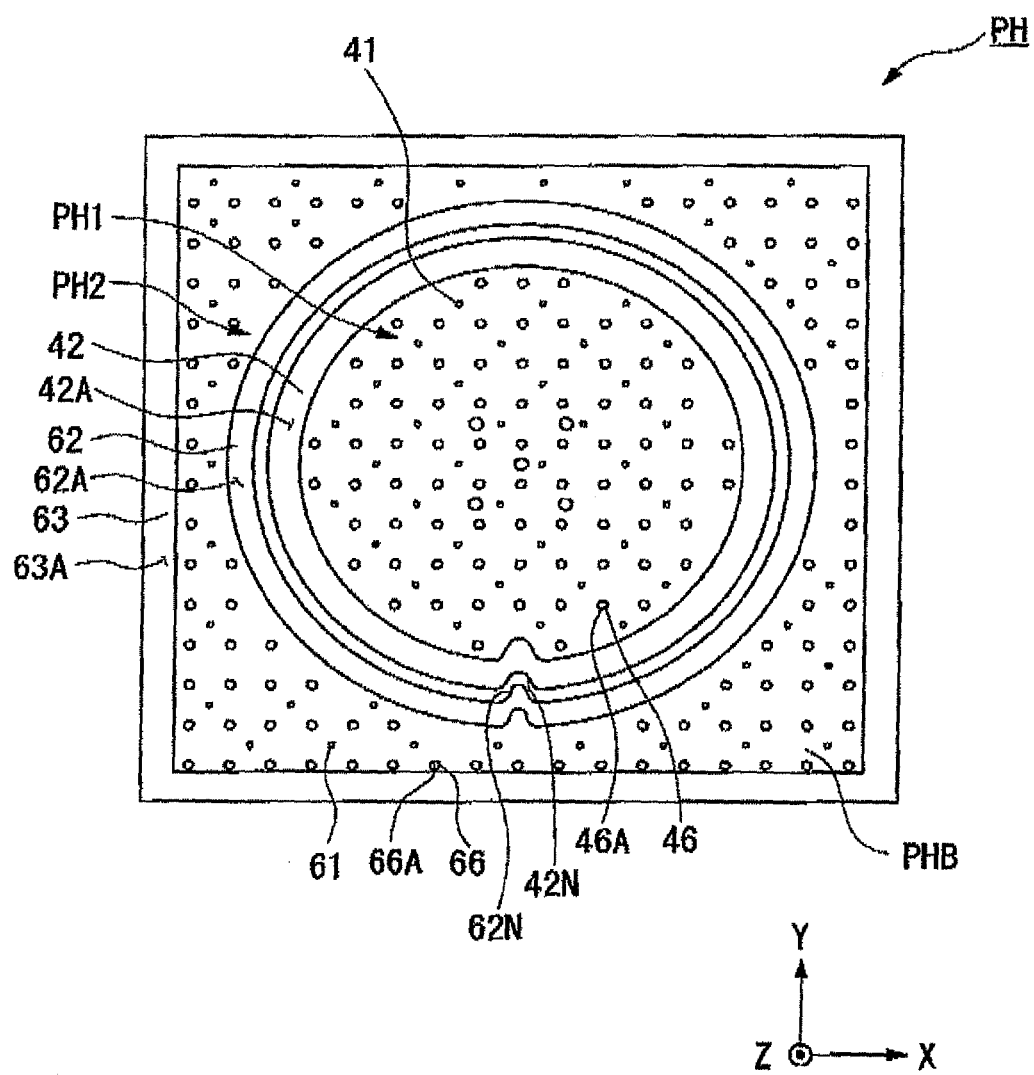
FIG. 3 is a plan view showing a substrate holder.
Figure 4:
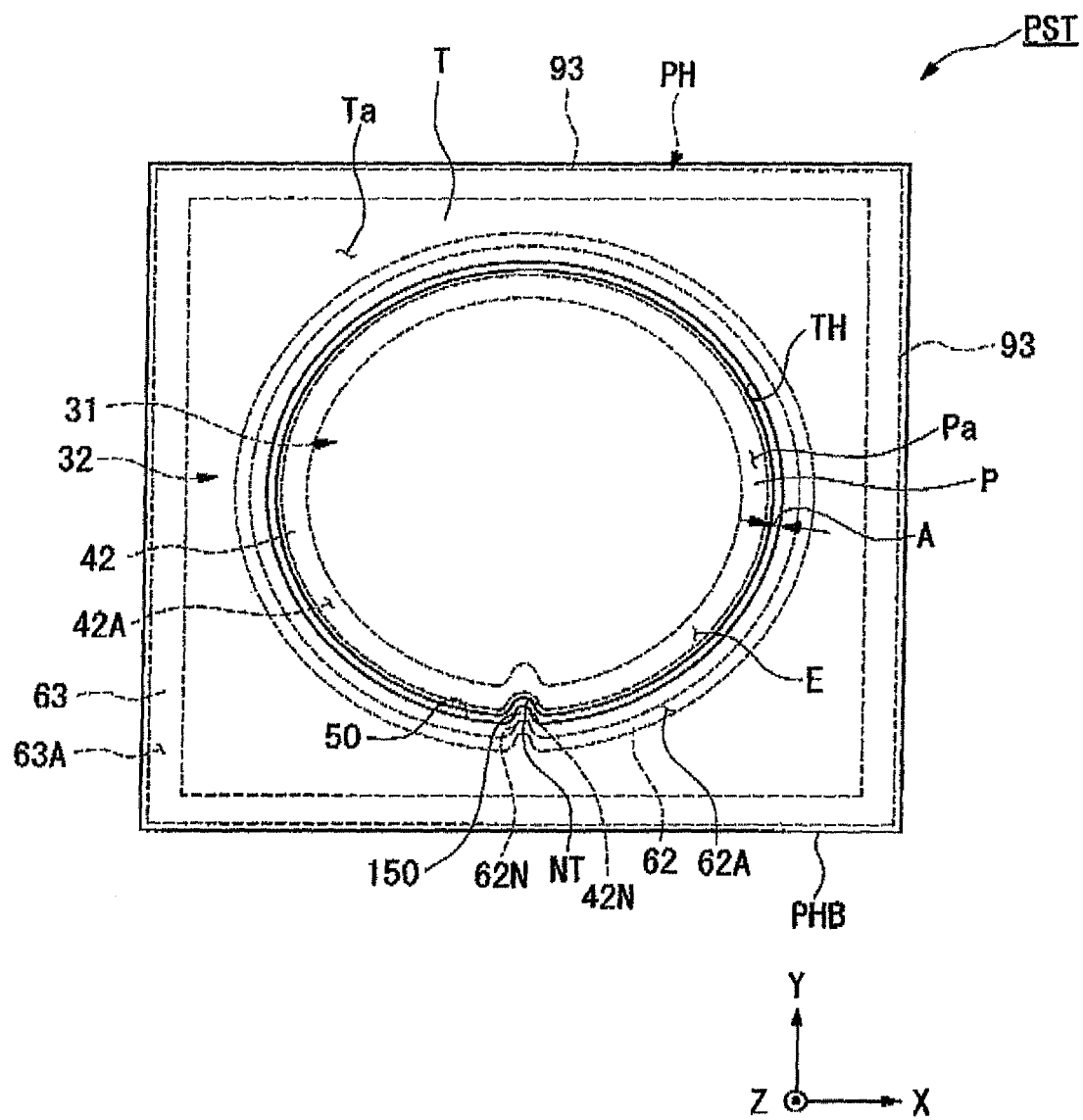
FIG. 4 is a plan view of a substrate stage.

Next, referring to FIGS. 2-4, substrate stage PST (substrate holder PH) will be described. FIG. 2 is a sectional side view of substrate P and substrate holder PH having sucked and held plate member T, described later; FIG. 3 is a plan view of substrate holder PH viewed from above; FIG. 4 is a plan view of substrate stage PST viewed from above.

In FIG. 2, substrate holder PH is provided with base member PHB, with first holding portion PH1 that is formed on base member PHB and suck-and-holds substrate P, and with second holding portion PH2 that is formed on base member PHB and suck-and-holds plate member T so as to surround substrate P suck-and-held by first holding portion PH1. Plate member T is a member different from base member PHB and is provided detachably (exchangeably) relative to base member PHB of substrate holder PH. Further, as shown in FIG. 4, plate member T is an approximately ring-shaped member, and in the center portion thereof is formed an approximately circular hole portion TH in which substrate P can be placed. Plate member T held by second holding portion PH2 is placed so as to surround the circumference of substrate P held by first holding portion PH1. The outline of plate member T is formed be rectangular as viewed from above so as to follow the shape of base member PHB. In the embodiment, the state in which plate member T is suck-and-held by base member PHB is referred to as substrate stage PST.

In FIG. 2, each of upper side surface Ta and rear surface Tb of plate member T is formed to be a flat surface (flat portion). Further, the thickness of plate member T is substantially the same as that of substrate P. And, surface (flat surface) Ta of plate member T held by second holding portion PH2 and upper side surface Pa of substrate P held by first holding portion PH1 are substantially co-planer with each other. In other words, plate member T held by second holding portion PH2 forms, around substrate P held by first holding portion PH1, surface Ta that constitutes substantially the same plane as surface Pa of substrate P. In the embodiment, when substrate P is held by substrate stage PST, the upper surface of substrate stage PST, including surface Pa of substrate P held, is formed so that it forms a flat surface over substantially the whole area.

As shown in FIGS. 2 and 3, first holding portion PH1 of substrate holder PH is provided with protruding first supporting portions 46 formed on base member PHB and with a ring-shaped first peripheral wall portion 42 formed on base member PHB so as to surround the circumference of first supporting portions 46. First supporting portions 46 are for supporting rear surface Pb of substrate P and are formed plurally and uniformly inside first peripheral wall portion 42. In the embodiment, first supporting portions 46 include a plurality of supporting pins. First peripheral wall portion 42 is formed to be approximately ring-shaped in accordance with the shape of substrate P. Upper surface 42A of first peripheral wall portion 42 is formed so as to face the peripheral region (edge region) of rear surface Pb of substrate P. On the side of rear surface Pb of substrate P held by first holding portion PH1 is formed first space 31 surrounded by base member PHB, first peripheral wall portion 42, and rear surface Pb of substrate P.

Inside portion of first peripheral wall portion 42 on base member PHB are formed first suction ports 41. First suction ports 41 are for suck-and-holding substrate P, and each of them is provided, inside first peripheral wall portion 42, at each of predetermined positions on the upper surface of base member PHB, the predetermined positions being other than the positions where first supporting portions 46 are located. In the embodiment, first suction ports 41 are provided plurally and uniformly inside first peripheral wall portion 42. Each of first suction ports 41 is connected to first vacuum system 40 via flow path 45. First vacuum system 40 includes a vacuum pump and is for making first space 31 surrounded by base member PHB, first peripheral wall portion 42, and rear surface Pb of substrate P have a negative pressure. As described above, first supporting portions 46 include the supporting pins, and first holding portion PH1 of the embodiment constitutes at least a portion of a so-called pin chuck mechanism. First peripheral wall portion 42 functions as an outer wall surrounding the outside of first space 31 including first supporting portions 46. Controller CONT drives first vacuum system 40 to suck out the gas (air) inside first space 31 surrounded by base member PHB, first peripheral wall portion 42, and substrate P and thus to make first space 31 have a negative pressure, thereby substrate P is suck-and-held by first supporting portions 46.

Second holding portion PH2 of substrate holder PH is provided with an approximately ring-shaped second peripheral wall portion 62 formed on base member PHB so as to surround first peripheral wall portion 42 of first holding portion PH1, with a ring-shaped third peripheral wall portion 63 that is provided outside second peripheral wall portion 62 and is formed on base member PHB so as to surround second peripheral wall portion 62, and with protruding second supporting portions 66 formed on base member PHB, the portion being located between second peripheral wall portion 62 and third peripheral wall portion 63. Second supporting portions 66 are for supporting rear surface Pb of substrate P and are formed plurally and uniformly between second peripheral wall portion 62 and third peripheral wall portion 63. In the embodiment, as with first supporting portions 46, second supporting portions 66 are also constituted by including a plurality of pins. Second peripheral wall portion 62 is provided outside first peripheral wall portion 42 relative to first space 31, and third peripheral wall portion 63 is provided further outside second peripheral wall portion 62. Further, second peripheral wall portion 62 is formed to be approximately ring-shaped to correspond to the shape of hole portion TH of plate member T, third peripheral wall portion 63 is formed to be approximately rectangle-shaped to correspond to the outline of plate member T. Upper surface 62A of second peripheral wall portion 62 is formed so as to face the inner, peripheral region (edge region on the inner side), located in the vicinity of hole portion TH, of rear surface Tb of plate member T. Upper surface 63A of third peripheral wall portion 63 is formed so as to face the outer, peripheral region (edge region on the outer side) of rear surface Tb of plate member T. On the side of rear surface Tb of plate member T held by second holding portion PH2 is formed second space 32 surrounded by base member PHB, second peripheral wall portion 62, third peripheral wall portion 63, and rear surface Tb of plate member T.

Second suction ports 61 are formed between second peripheral wall portion 62 and third peripheral wall portion 63 on base member PHB. Second suction ports 61 are for suckand-holding plate member T, and each of them is provided, between second peripheral wall portion 62 and third peripheral wall portion 63, at each of predetermined positions on the upper surface of base member PHB, the predetermined positions being other than the positions where second supporting portions 66 are located. In the embodiment, second suction ports 61 are provided plurally and uniformly between second peripheral wall portion 62 and third peripheral wall portion 63.

Each of second suction ports 61 is connected to second vacuum system 60 via flow path 65. Second vacuum system 60 includes a vacuum pump and is for making second space 32 surrounded by base member PHB, second peripheral wall portion 62, third peripheral wall portion 63, and rear surface Tb of plate member T have a negative pressure. As described above, second supporting portions 66 include the supporting pins, and, as with first holding portion PH1, second holding portion PH2 of the embodiment also constitutes at least a portion of a so-called pin chuck mechanism. Second peripheral wall portion 62 and third peripheral wall portion 63 function as an outer wall surrounding the outside of second space 32 including second supporting portions 66. Controller CONT drives second vacuum system 60 to suck out the gas (air) inside second space 32 surrounded by base member PHB, second peripheral wall portion 62, third peripheral wall portion 63, and plate member T and thus to make second space 32 have a negative pressure, plate member T is suck-and held by second supporting portions 66.

It is to be noted that while, in the embodiment, the pin chuck mechanism is used for suck-and-holding substrate P, another type of chuck mechanism may be adopted. Similarly, while the pin chuck mechanism is used for suck-and-holding plate member T, another type of chuck mechanism may be adopted. Further, while, in the embodiment, the vacuum suction mechanisms are adopted for suck-and-holding substrate P and plate member T, it may also be configured such that at least one of substrate P and plate member T is held by using another type of mechanism, e.g., an electrostatic suction mechanism.

First vacuum system 40 for making first space 31 have a negative pressure and second vacuum system 60 for making second space 32 have a negative pressure are independent of each other. Controller CONT can control separately the operation of first vacuum system 40 and the operation of second vacuum system 60, and the suction operation by first vacuum system 40 for first space 31 and the suction operation by second vacuum system 60 for second space 32 can be performed independently of each other. Further, by controlling each of first vacuum system 40 and second vacuum system 60, controller CONT can also make the pressure of first space 31 and the pressure of second space 32 different from each other.

As shown in FIGS. 2 and 4, between the outer edge portion of substrate P held by first holding portion PH1 and the inner side (hole portion TH side) edge portion of plate member T provided around substrate P is formed gap (clearance) A of about 0.1 to 1.0 mm. In the embodiment, gap A is of about 0.3 mm.

Further, as shown in FIG. 4, substrate P of the embodiment has notch portion NT, which is a cut portion for alignment. The shape of plate member T is determined in accordance with the outline of substrate P (the shape of notch portion NT) so that the gap between substrate P and plate member T at the position of notch portion NT is also set to be of about 0.1 to 1.0 mm. Specifically, plate member T has protrusion portion 150 protruding toward the inner side of hole portion TH so as to correspond to the shape of notch portion NT. With this configuration, gap A of about 0.1 to 1.0 mm is secured between the entire region of the edge portion of substrate P, including notch portion NT, and plate member T. Further, second peripheral wall portion 62 and its upper surface 62A of second holding portion PH2 has protruding or convex portion 62N that corresponds to the shape of protrusion portion 150 of plate member T.

Further, first peripheral wall portion 42 and its upper surface 42A of first holding portion PH1 has depression or recess portion 42N that corresponds to the shape of protruding portion 62N of second peripheral wall portion 62 and the shape of notch portion NT of substrate P. Depression portion 42N of first peripheral wall portion 42 is provided in the position facing protruding portion 62N of second peripheral wall portion 62, and between depression portion 42N and protruding portion 62N is formed a predetermined gap.

It should be noted that the above description has been made by assuming, by way of example, notch portion NT as a cut portion of substrate P, but when there is no cut portion or when substrate P has an orientation flat portion ("orifla" portion) as a cut portion, it may be configured such that each of the shapes of plate member T, first peripheral wall portion 42, and second peripheral wall portion 62 is made to have a shape corresponding to the outline of substrate P to secure the predetermined gap A between substrate P and plate member T therearound.

Figure 5:
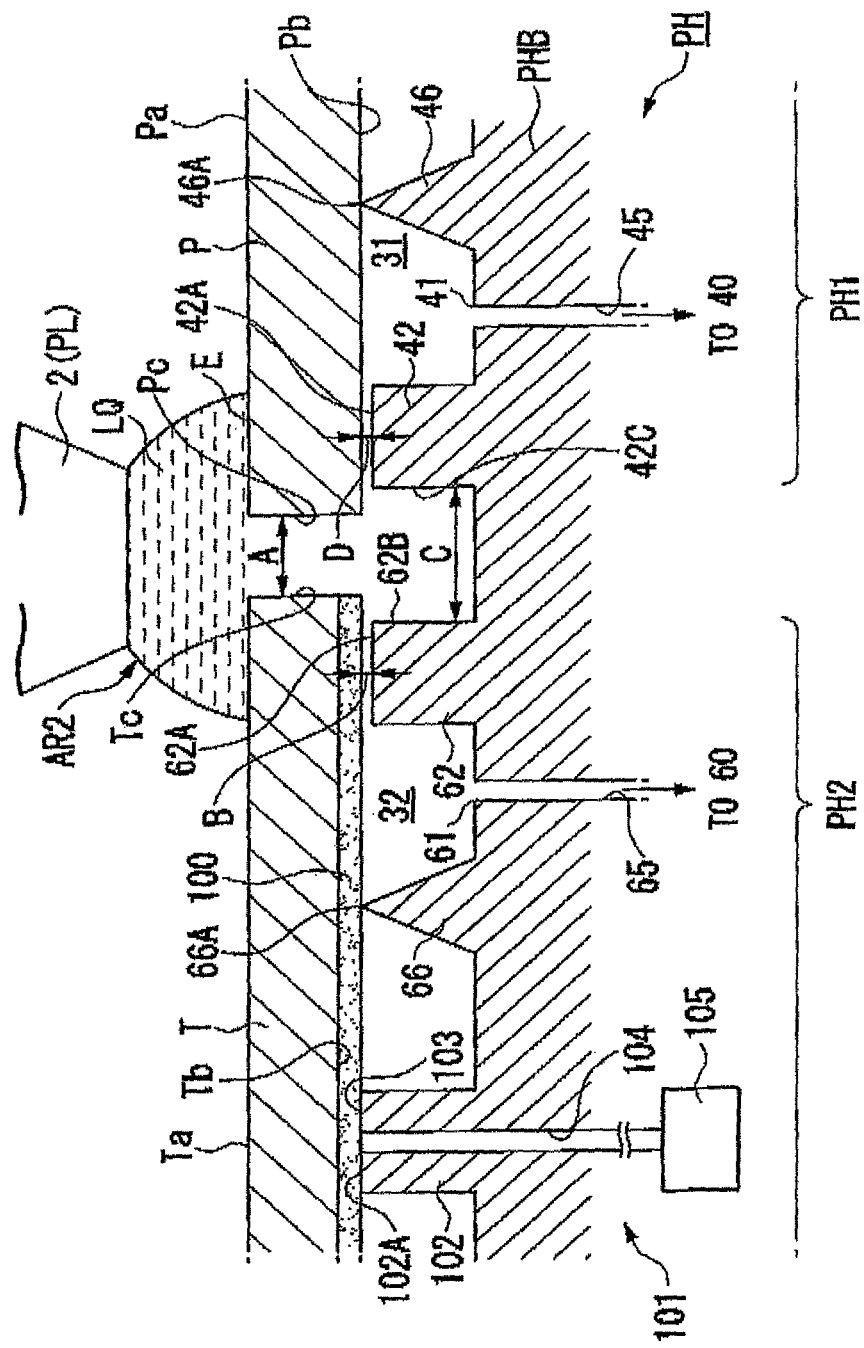
FIG. 5 is an enlarged sectional view of a main portion of a substrate holder of a first embodiment.

FIG. 5 is an enlarged sectional view of substrate P and the main portion of substrate holder PH on which plate member T is held.

In FIG. 5, between side surface Pc of substrate P and plate member T's side surface Tc facing side surface Pc is secured gap A of about 0.1 to 1.0 mm, as described above. Further, each of upper surface 42A of first peripheral wall portion 42 and upper surface 62A of second peripheral wall portion 62 is a flat surface. Note that, although not shown in FIG. 5, upper surface 63A of third peripheral wall portion 63 is also a flat surface. Further, in the embodiment, first supporting portions 46 of first holding portion PH1 are formed to have the same or slightly higher height compared with first peripheral wall portion 42. And, rear surface Pb of substrate P is supported by upper surfaces 46A of first supporting portions 46.

On rear surface Tb of plate member T is disposed absorbing member 100 that is capable of absorbing liquid LQ. Absorbing member 100 is for absorbing liquid LQ having penetrated through gap A and is formed by a porous member, including a sponge member. Absorbing member 100 may provided on approximately the entire region of rear surface Tb of plate member T or may be provided on only the inner, peripheral region, located near hole portion TH, of rear surface Tb of plate member T.

Second supporting portions 66 of second holding portion PH2 is formed to have a height slightly larger than that of second peripheral wall portion 62. Even in the state in which with second space 32 being made to have a negative pressure, plate member T is suck-and-held on second supporting portions 66, gap B is formed between rear surface Tb of plate member T (including the rear surface of absorbing member 100) and upper surface 62A of second peripheral wall portion 62. Gap B is smaller than gap A and is of about a few μm (e.g., 3 μm). Since gap B is very small, the negative pressure of second space 32 maintained.

Further, second holding portion PH2 is provided with recovery mechanism 101 that suck-and-recovers liquid LQ having been absorbed and held by absorbing member 100. Recovery mechanism 101 is provided with protruding portion 102 that is formed in predetermined position on base member PHB, the predetermined position being located between second peripheral wall portion 62 and third peripheral wall portion 63, with recovery ports 103 formed on upper surface 102A of protruding portion 102, and with vacuum system 105 that is connected to recovery ports 103 via flow path 104. Each of recovery ports 103 is formed at each of predetermined positions on upper surface 102A of protruding portion 102. Protruding portion 102 is provided so that upper surface 102A of protruding portion 102 comes into contact with absorbing member 100 on rear surface Tb of plate member T held by second supporting portions 66. When vacuum system 105 is activated, liquid LQ held by absorbing member 100, which is a porous member, is suck-and-recovered by and into vacuum system 105 via recovery ports 103, which are in contact with absorbing member 100, and is then stored into a predetermined tank. Since recovery ports 103 are formed on upper surface 102A, which is in contact with absorbing member 100, liquid LQ held by absorbing member 100 can be smoothly recovered. It is to be noted that although not shown, midway along flow path 104 between recovery ports 103 and vacuum system 105 is provided a gas-liquid separator that separates liquid LQ recovered through recovery ports 103 from gas, and thus liquid LQ is prevented from flowing into vacuum system 105.

It should be noted that protruding portion 102 is only required to be provided in such a manner that upper surface 102A and absorbing member 100 on rear surface Tb of plate member T come into contact with each other and may be, for example, formed to be ring-shaped as viewed from above or may be formed such that supporting frame 120 is divided into multiple, smaller portions, and each of the smaller portions is formed in each of multiple, predetermined positions on base member PHB. Further, upper surface 102A is not necessarily be required to be in contact with absorbing member 100 and, in short, is only required to be capable of recovering, via recovery ports 103, liquid LQ held by absorbing member 100.

Further, between first peripheral wall portion 42 and second peripheral wall portion 62 is formed gap C. Gap C is larger than gap A and is, e.g., of about 2.5 mm. Further, the outside diameter of the ring-shaped first peripheral wall portion 42 of first holding portion PH1 is formed to be smaller than the diameter of substrate P, and thus the peripheral region of substrate P overhangs outside first peripheral wall portion 42 by a predetermined amount. Further, the inside diameter of the ring-shaped second peripheral wall portion 62 is formed to be larger than the inside diameter of hole portion TH of plate member T, and thus the inner, peripheral region located near hole portion TH of plate member T overhangs inside second peripheral wall portion 62 by a predetermined amount.

Further, between rear surface Pb of substrate P and upper surface 42A of first peripheral wall portion 42 is formed a predetermined gap D. In the embodiment, gap B, gap D, the negative pressure of first space 31, and the negative pressure of second space 32 are set so that the suction force exerted on liquid LQ toward gap B becomes larger than the suction force exerted on liquid LQ toward gap D.

Further, second suction ports 61 formed on base member PHB have a function of liquid recovery ports for recovering liquid LQ having penetrated through gap A between substrate P held by first holding portion PH1 and plate member T held by second holding portion PH2. In other words, it is configured such that even when liquid LQ that had penetrated through gap A has penetrated into second space 32 via gap B, liquid LQ is suck-and-recovered through second suction ports 61. Here, also midway along flow path 65, which connects second suction ports 61 and second vacuum system 60, is provided a gas-liquid separator, and thus liquid LQ having recovered through second suction ports 61 is prevented from flowing into second vacuum system 60.

Returning to FIG. 2, upper surface 63A of third peripheral wall portion 63 is a flat surface, and third peripheral wall portion 63 is formed to have a slightly lower height compared with second supporting portions 66. And, between upper surface 63A of third peripheral wall portion third peripheral wall portion 63 and rear surface Tb of plate member T is formed a predetermined gap K. Further, plate member T is formed to be larger than the outline of third peripheral wall portion 63, and thus the outer, peripheral region of plate member T overhangs outside third peripheral wall portion 63 by a predetermined amount. There is a possibility that when liquid LQ on plate member T flows out to the outside of plate member T, liquid LQ having flowed out adheres to moving mirror 93 provided on the side face of substrate holder PH. However, since plate member T overhangs outside third peripheral wall portion 63 and, thus, outside moving mirror 93, liquid LQ having flowed out to the outside of plate member T is prevented from adhering to moving mirror 93. Further, since gap K is formed between plate member T and upper surface 63A of third peripheral wall portion 63, there is generated a gas flow proceeding from the outside of second space 32 to the inside thereof via gap K, with second space 32 being made to have a negative pressure by second vacuum system 60. Thus, since liquid LQ having flowed out to the outside of plate member T is drawn into second space 32 via gap K before liquid LQ flows to the side face of substrate holder PH, including moving mirror 93, the disadvantage that liquid LQ would adhere to moving mirror 93 can be more reliably prevented.

Each of surface Ta, rear surface Tb, and side surface Tc of plate member T is coated with a liquid-repellent material having a liquid-repellency relative to liquid LQ. As the liquid-repellent material, there can be listed, e.g., a fluoroplastic material, e.g., polytetrafluoroethylene and an acrylic plastic material. In the embodiment, plate member T made of silica glass is coated with "CYTOP", manufactured by Asahi Glass Co., Ltd. It is to be noted that as the liquid-repellent material with which plate member T is to be coated, HMDS (hexamethyl-disilazane) may also be used. Alternatively, in order to make plate member T liquid-repellent, plate member T itself may be formed by a liquid-repellent material such as a fluoro-material.

Surface Pa, which is the exposure surface of substrate P, is coated with photoresist (a photosensitive material). In the embodiment, the photosensitive material is a photosensitive material for ArF excimer laser and has a liquid-repellency relative to liquid LQ. Further, in the embodiment, rear surface Pb and side surface Pc of substrate P are also coated with a liquid-repellent material having a liquid-repellency relative to liquid LQ. As the liquid-repellent material with which rear surface Pb and side surface Pc of substrate P are to be coated, the above-mentioned photosensitive material can be listed. Further, there is a case where a protective layer (film for protecting the photosensitive material from the liquid), called top coat layer, is applied on the photosensitive material applied on surface Pa, which is the exposure surface of substrate P; in this connection, when the material for forming the top coat layer is a liquid-repellent material, e.g., a fluoroplastic material, the material for forming the top coat layer may be used as the liquid-repellent material with which rear surface Pb and side surface Pc of substrate P are to be coated. Further, as the liquid-repellent material with which rear surface Pb and side surface Pc of substrate P are to be coated, HMDS (hexamethyl-disilazane) may also be used. Further, it may also be configured such that surface Pa of substrate P is coated with HMDS as the top coat layer.

Further, it may also be configured such that by applying a liquid-repellency treatment to at least a portion of the surface of base member MB of substrate holder PH, a liquid-repellency relative to liquid LQ is given thereto. In the embodiment, of base member PHB of substrate holder PH, upper surface 42A and outside surface 42C (the face facing second peripheral wall portion 62) of first peripheral wall portion 42 of first holding portion PH1 and upper surfaces 46A of first supporting portions 46 have a liquid-repellency. Further, upper surface 62A and inside surface 62B (the surface facing first peripheral wall portion 42) of second peripheral wall portion 62 of second holding portion PH2 and upper surfaces 66A of second supporting portions 66 have a liquid-repellency. As the liquid-repellency treatment for substrate holder PH, there can be a treatment in which such a fluoroplastic material, an acrylic plastic material, a photosensitive material, a material for forming a top coat layer, HMDS, or the like as described above is used for coating.

Next, there will be described an example of the operation of exposure apparatus EX having the above-described configuration and the working of substrate holder PH.

Exposure apparatus main body EX of the embodiment is a scan type exposure apparatus (the so-called scanning stepper) in which while moving mask M and substrate P in the X-direction (scanning direction), the pattern image of mask M is projected onto substrate P; and, during scanning exposure, a pattern image of a part of mask M is projected onto projection area AR1 via liquid LQ of liquid immersion region AR2 and projection optical system PL, and in synchronization with the movement of mask M in the −X direction (or in the +X direction) at speed V, substrate P moves, relative to projection area AR1, in the +X direction (or in the −X direction) at speed $\beta \cdot V$ ($\beta$ is the projection magnification). On substrate P are set a plurality of shot areas. After completion of exposure of one shot area, a next shot area moves to the scan starting position through the stepping movement of substrate P. In this way, the scanning exposure process of each shot area is successively performed, with substrate P being moved in accordance with the step-and-scan method.

When exposing peripheral area (edge area) E of surface Pa of substrate P, there arises, as shown in FIG. 5, a state in which a portion of liquid immersion region AR2 formed on the image plane side of projection optical system PL is formed outside substrate P, and in this state, liquid immersion region AR2 of liquid LQ is formed on gap A. In this case, there is a possibility that liquid LQ of liquid immersion region AR2 penetrates through gap A and finds its way over to the side of rear surface Pb of substrate P. However, since gap A between substrate P held by first holding portion PH1 and plate member T held by second holding portion PH2 is set to be of about 0.1 to 1.0 mm, penetration of liquid LQ into gap A is prevented through the surface tension of liquid LQ. Further, since, in the embodiment, surface Ta and side surface Tc of plate member T are liquid-repellent, and, at the same time, side surface Pc of substrate P is also liquid-repellent, penetration of liquid LQ from gap A is more reliably prevented. Thus, even when exposing edge area E of substrate P, liquid LQ can be held beneath projection optical system PL by plate member T.

Further, even if liquid LQ has penetrated from gap A, since on rear surface Tb of plate member T is provided absorbing member 100, which absorbs liquid LQ, liquid LQ having penetrated from gap A is, without getting into the side of rear surface Pb of substrate P, drawn to the side of rear surface Tb of plate member T and is absorbed by absorbing member 100. Thus, the disadvantage that liquid LQ having penetrated from gap A would find its way over to the side of rear surface Pb of substrate P can be prevented.

Further, since liquid LQ absorbed (held) by absorbing member 100 is recovered by recovery mechanism 101, such a disadvantage that liquid LQ would drop from absorbing member 100 onto, e.g., base member PHB inside second space 32 is prevented. It should be noted that even if liquid LQ has dropped from absorbing member 100, since, as described above, second suction ports 61 formed on base member PHB have a function of liquid recovery ports for recovering liquid LQ, the dropped liquid LQ can be recovered via second suction ports 61.

Further, since, in the embodiment, gap B, gap D, the negative pressure of first space 31, and the negative pressure of second space 32 are set so that the suction force exerted on liquid LQ toward gap B becomes larger than the suction force exerted on liquid LQ toward gap D, as described above, liquid LQ having penetrated from gap A can be smoothly drawn to the side of rear surface Tb of plate member T, and thus the disadvantage that liquid LQ having penetrated from gap A would get into the side of rear surface Pb of substrate P can be prevented. It should be noted that by making rear surface Pb of substrate P and upper surface 42A of first peripheral wall portion 42 in direct contact with each other and thus by making gap D substantially zero, it can be more reliably prevented that liquid LQ having penetrated from gap A penetrates into the side of first space 31 via between rear surface Pb of substrate P and upper surface 42A of first peripheral wall portion 42.

It should be noted that, in the embodiment, liquid LQ held by absorbing member 100 is recovered by recovery mechanism 101, but it may also be configured such that absorbing member 100 is provided detachably (exchangeably) relative to plate member T, and when absorbing member 100 provided on rear surface Tb of plate member T has held a predetermined amount of liquid LQ, the absorbing member is replaced by a new one.

Second Embodiment

Next, a second embodiment of the present invention will be described referring to FIG. 6. In the following description, the same or equivalent constituent elements as those in the above-described embodiment are denoted by the same reference letters or numerals, and their descriptions will be abridged or omitted.

Figure 6:
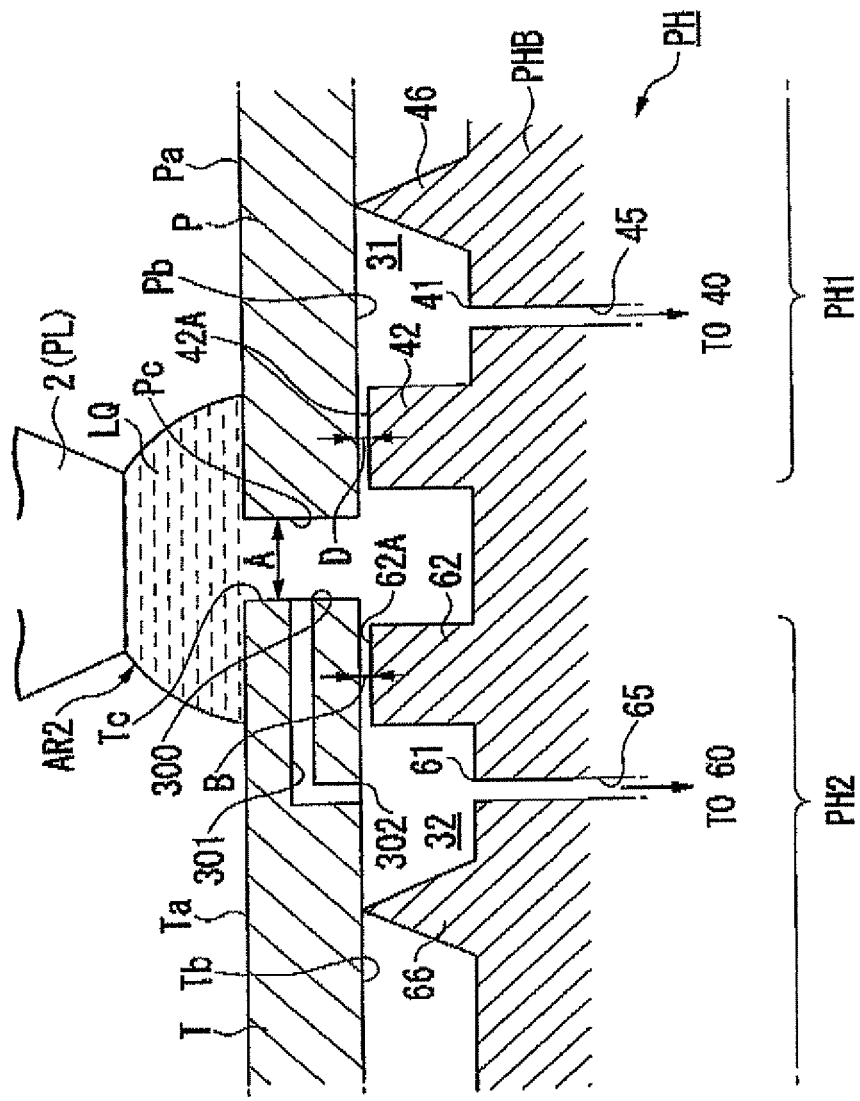
FIG. 6 is an enlarged sectional view of a main portion of a substrate holder of a second embodiment.

In FIG. 6, with respect to plate member T held by second holding portion PH2, on side surface Tc facing substrate P is provided recovery port 300 that recovers liquid LQ. Inside plate member T is formed inner flow path 301 which is connected to recovery port 300 and through which liquid LQ flows. Recovery port 300 is connected to one end portion of inner flow path 301; the other end portion of inner flow path 301 is connected to opening portion 302 provided in a predetermined position on rear surface Tb of plate member T. Opening portion 302 is formed in a position where when second holding portion PH2 holds plate member T, the opening portion 302 is disposed on second space 32. In other words, inner flow path 301 of plate member T is provided so that inner flow path 301 connects recovery port 300 with second space 32.

In fact, recovery ports 300 are formed plurally on side surface Tc of plate member T at predetermined intervals in the circumferential direction; inner flow paths 301 are also provided plurally in accordance with the number of recovery ports 300. Further, while, in FIG. 6, it is illustrated in such a manner that one opening portion 302 is provided for one recovery port 300, it may also be configured such that a plurality of opening portions 302 are provided for one recovery port 300, that inner flow path 301, starting from the recovery port, is made to branch along its way toward the other end into a plurality of inner flow paths, and that each of the branch inner flow paths is connected to each of the plurality of opening portions 302.

By making second space 32 have a negative pressure by activating second vacuum system 60, controller CONT can make plate member T's inner flow paths 301, which connect to second space 32, have a negative pressure. With inner flow paths 301 having a negative pressure, liquid LQ having penetrated from gap A between substrate P held by first holding portion PH1 and plate member T held by second holding portion PH2 is recovered via recovery ports 300. Liquid LQ having been recovered via recovery ports 300 flows through inner flow paths 301 and then flows into second space 32 via opening portions 302. Here, since, as with the above-described first embodiment, second suction ports 61 provided inside second space 32 have a function of liquid recovery ports for recovering liquid LQ, the liquid LQ having recovered via recovery ports 300 of plate member T and having flowed through inner flow paths 301 is suck-and-recovered by second suction ports 61 (second vacuum system 60).

Since, as described above, even if liquid LQ has penetrated from gap A, the penetrated liquid LQ can be recovered via recovery ports 300, which are located inside gap A and are provided on plate member T's side surface Tc, the disadvantage that liquid LQ having penetrated from gap A would find its way over to the side of rear surface Pb of substrate P can be prevented.

Further, by making the recovery ports 300's vicinity areas on side surface Tc of plate member T and the inner walls of inner flow paths 301 lyophilic, liquid LQ can be more smoothly recovered. For example, by sandwiching pipe members made of a lyophilic material between two (or any plurality of) plate members for forming plate member T, lyophilic inner flow paths 301 can be formed inside plate member T.

Figure 7:
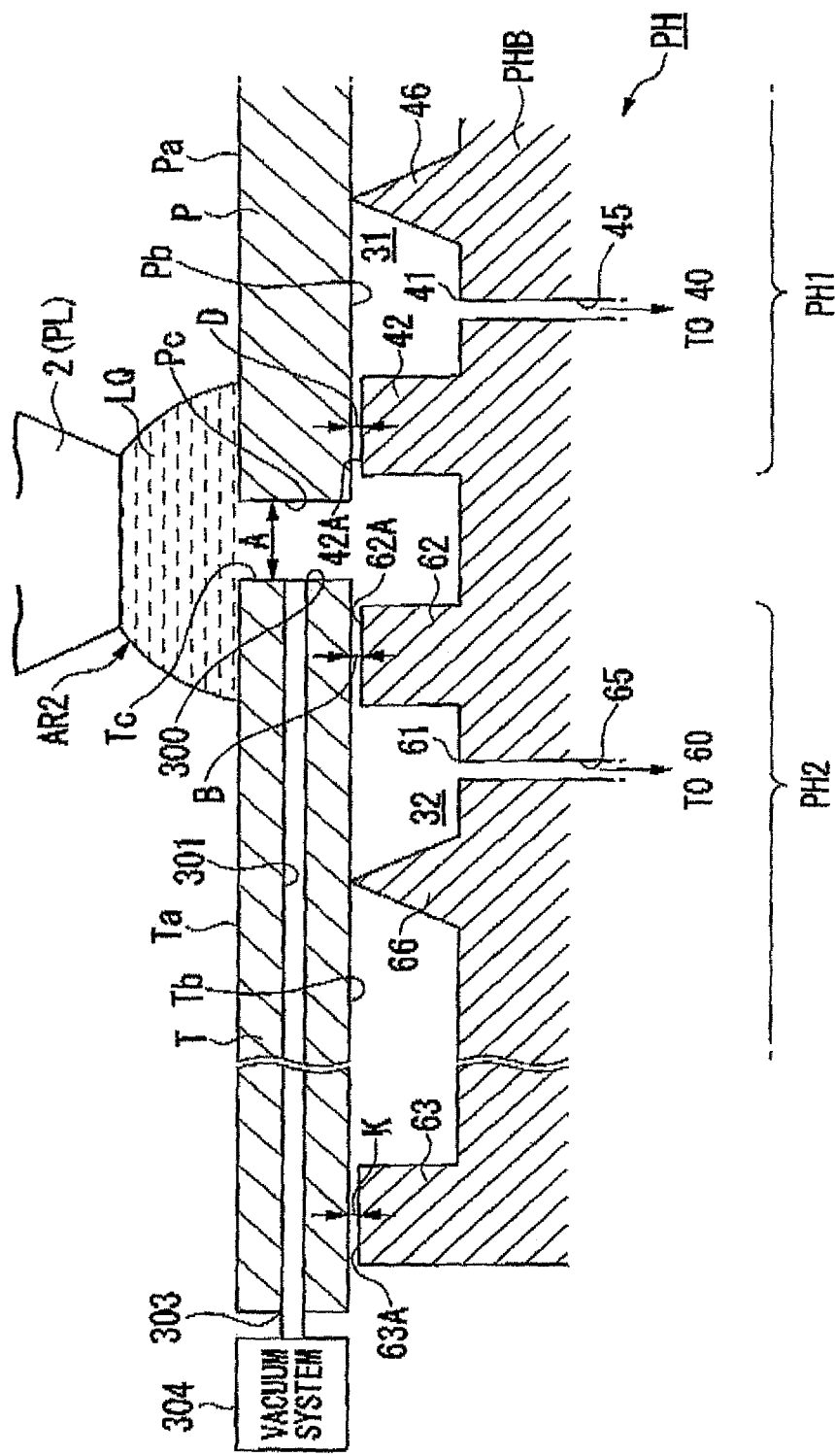
FIG. 7 is a drawing showing a modification example of the second embodiment.

It is to be noted that while, in the embodiment of FIG. 6, by connecting recovery ports 300 to second space 32 by inner flow paths 301 and by making second space 32 have a negative pressure by using second vacuum system 60, liquid LQ having penetrated from gap A is recovered via recovery ports 300, it may also be configured such that, as shown in FIG. 7, the other end of inner flow path 301 is connected to opening portion 303 formed in a predetermined position on the plate member T's side surface that does not face substrate P or in a predetermined position on plate member T's surface Ta, and, further, opening portion 303 is connected to vacuum system 304. By making inner flow paths 301 by activating vacuum system 304, controller CONT can recover liquid LQ via recovery ports 300. Liquid LQ having been recovered via recovery ports 300 flows through inner flow paths 301 and is then recovered by vacuum system 304 via opening portions 303.

Third Embodiment

Figure 8:
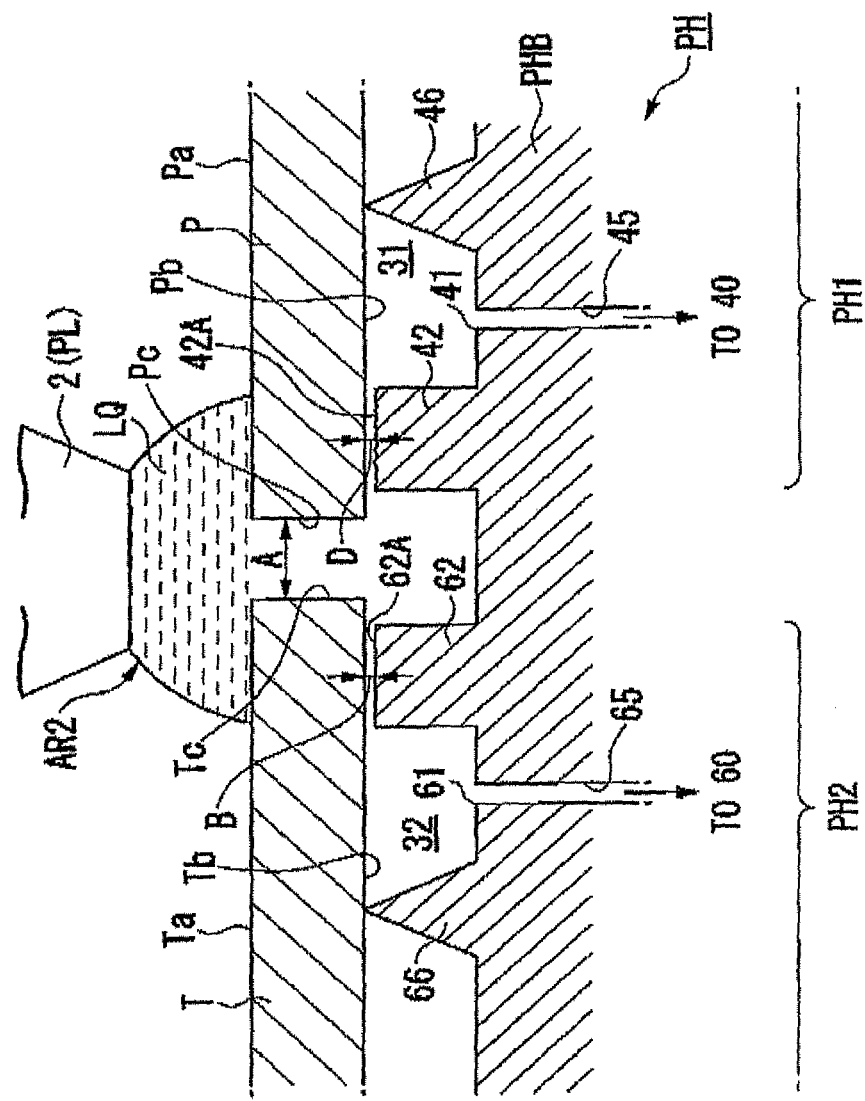
FIG. 8 is an enlarged sectional view of a main portion of a substrate holder of a third embodiment.

Next, a third embodiment of the present invention will be described referring to FIG. 8. In FIG. 8, first peripheral wall portion 42's upper surface 42A, which faces rear surface Pb of substrate P, is applied with a surface roughening treatment. Since first peripheral wall portion 42's upper surface 42A applied with a surface roughening treatment prevents the movement of liquid LQ at gap D formed between substrate P's rear surface Pb and upper surface 42A, even if liquid LQ has penetrated from gap A, it can be prevented that the penetrated liquid LQ penetrates from gap A into first space 31 on the side of substrate P's rear surface Pb via gap D.

Figure 9:
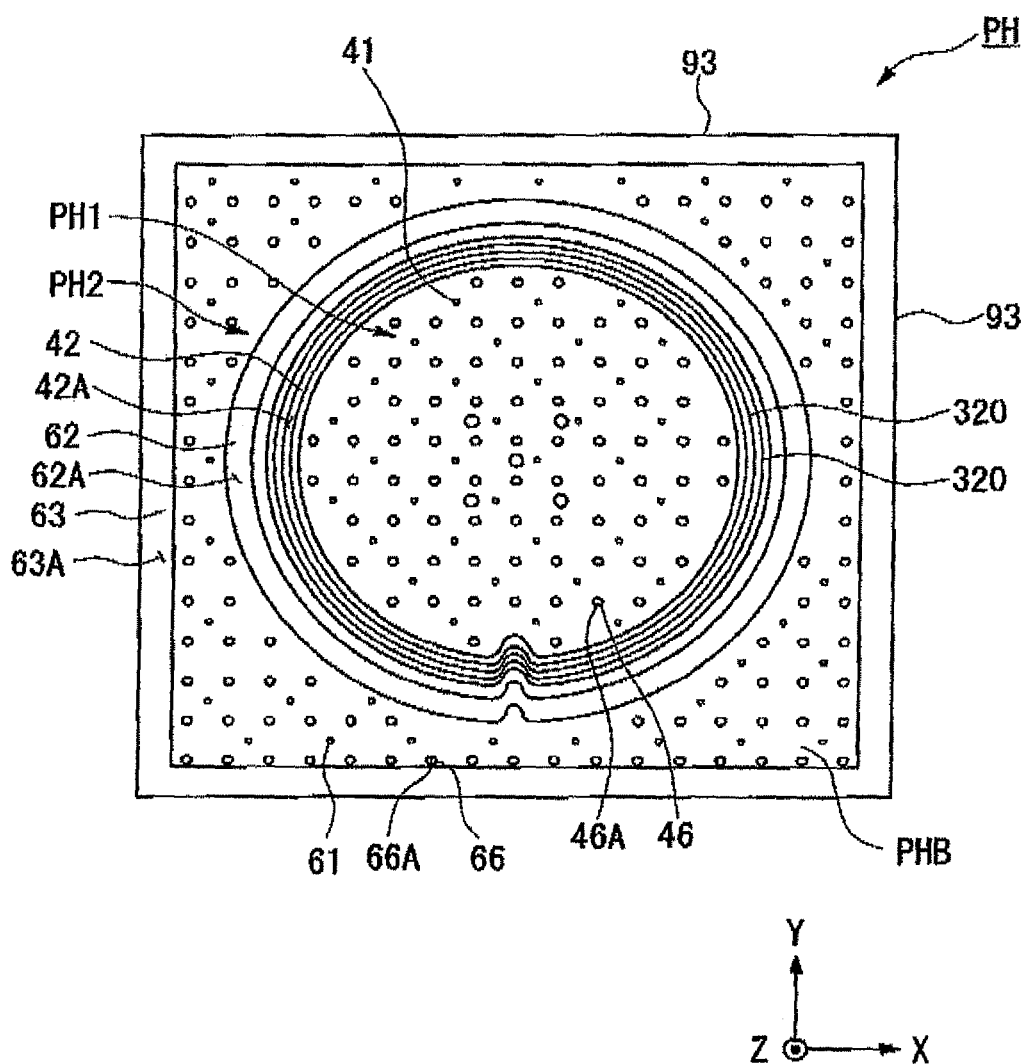
FIG. 9 is a drawing showing a modification example of the third embodiment.

It is to be noted that as the surface roughening treatment, a method of, e.g., sandblasting may used, or it may also be configured such that, as shown in FIG. 9, groove portions 320 are formed on first peripheral wall portion 42's upper surface 42A along the circumferential direction. In the example shown in FIG. 9, groove portions 320 are formed plurally and concentrically.

Fourth Embodiment

Figure 10:
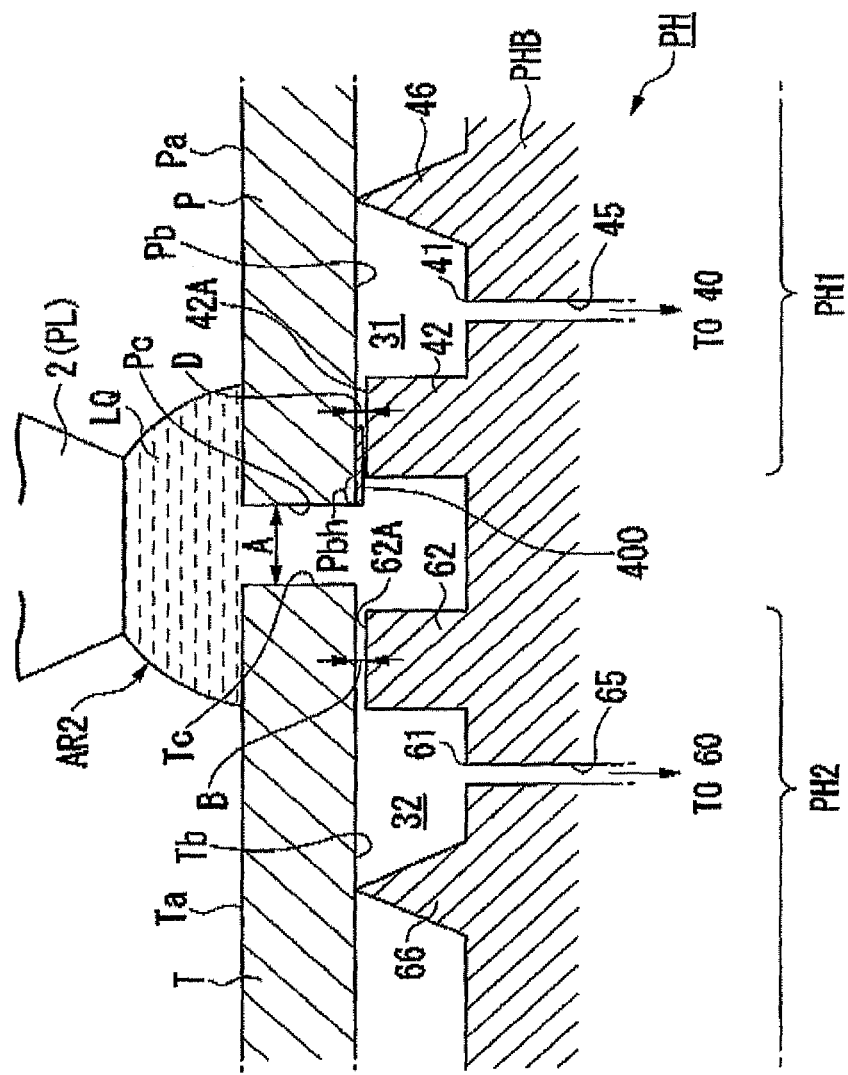
FIG. 10 is an enlarged sectional view of a main portion of a substrate holder of a fourth embodiment.

Next, a fourth embodiment of the present invention will be described referring to FIG. 10. In FIG. 10, sheet-shaped member 400 made of a liquid-repellent material is provided on a substrate P's rear surface Pb's portion located near gap A. As the liquid-repellent material forming sheet-shaped member 400, there can be listed, e.g., a fluoroplastic material and an acrylic plastic material. In this embodiment, "Gore-Tex (brand name)" is used for sheet-shaped member 400. Sheet-shaped member 400 is formed to be ring-shaped in accordance with the peripheral region of substrate P and is disposed on the substrate P's rear surface Pb's peripheral region. As described above, the peripheral region of substrate P overhangs outside first peripheral wall portion 42 by a predetermined amount, and sheet-shaped member 400 is disposed so that it includes substrate P's rear surface Pb's overhang region Pbh and a partial region of the rear surface Pb's region facing first peripheral wall portion 42's upper surface 42A. It is to be noted that sheet-shaped member 400 may be disposed only on substrate P's rear surface Pb's overhang region Pbh, which does not face first peripheral wall portion 42's upper surface 42A or may be disposed on a wide region of the substrate P's rear surface Pb's peripheral region so that sheet-shaped member 400 faces the entire region of upper surface 42A of first peripheral wall portion 42.

By, in this manner, disposing the liquid-repellent sheet-shaped member 400 on a substrate P's rear surface Pb's region that is located near gap A and includes the rear surface Pb's region outside gap D, even if liquid LQ having penetrated from gap A becomes liable to penetrate into first space 31 on substrate P's rear surface Pb, penetration of the liquid LQ can be hindered by sheet-shaped member 400.

Fifth Embodiment

Figure 11:
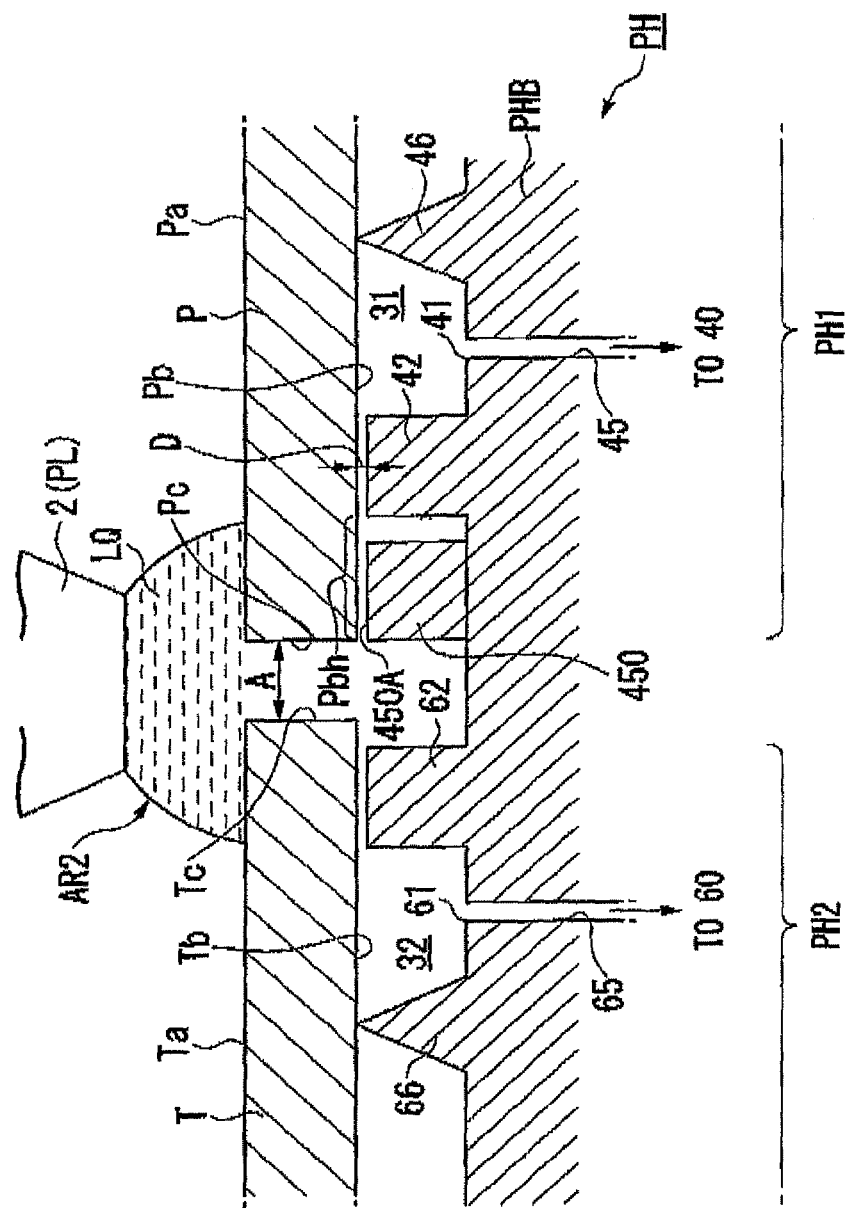
FIG. 11 is an enlarged sectional view of a main portion of a substrate holder of a fifth embodiment.

Next, a fifth embodiment of the present invention will be described referring to FIG. 11. In FIG. 11, on base member PHB and outside first peripheral wall portion 42 is provided liquid-repellent member 450 having a liquid-repellency relative to the liquid LQ. Liquid-repellent member 450 is formed to be ring-shaped so as to surround the outside of first peripheral wall portion 42. As the liquid-repellent material forming liquid-repellent member 450, there can be listed, e.g., a fluoroplastic material and an acrylic plastic material. As with the above-described fourth embodiment, "Gore-Tex (brand name)" is used for liquid-repellent member 450. Liquid-repellent member 450 is provided beneath overhang region Pbh of rear surface Pb of substrate P, and upper surface 450A of liquid-repellent member 450 faces rear surface Pb of substrate P held by first holding portion PH1.

By, in this manner, disposing liquid-repellent member 450 on a region that is located near gap A and outside gap D, even if liquid LQ having penetrated from gap A becomes liable to penetrate into first space 31 on substrate P's rear surface Pb, penetration of the liquid LQ can be prevented by liquid-repellent member 450.

Sixth Embodiment

Figure 12:
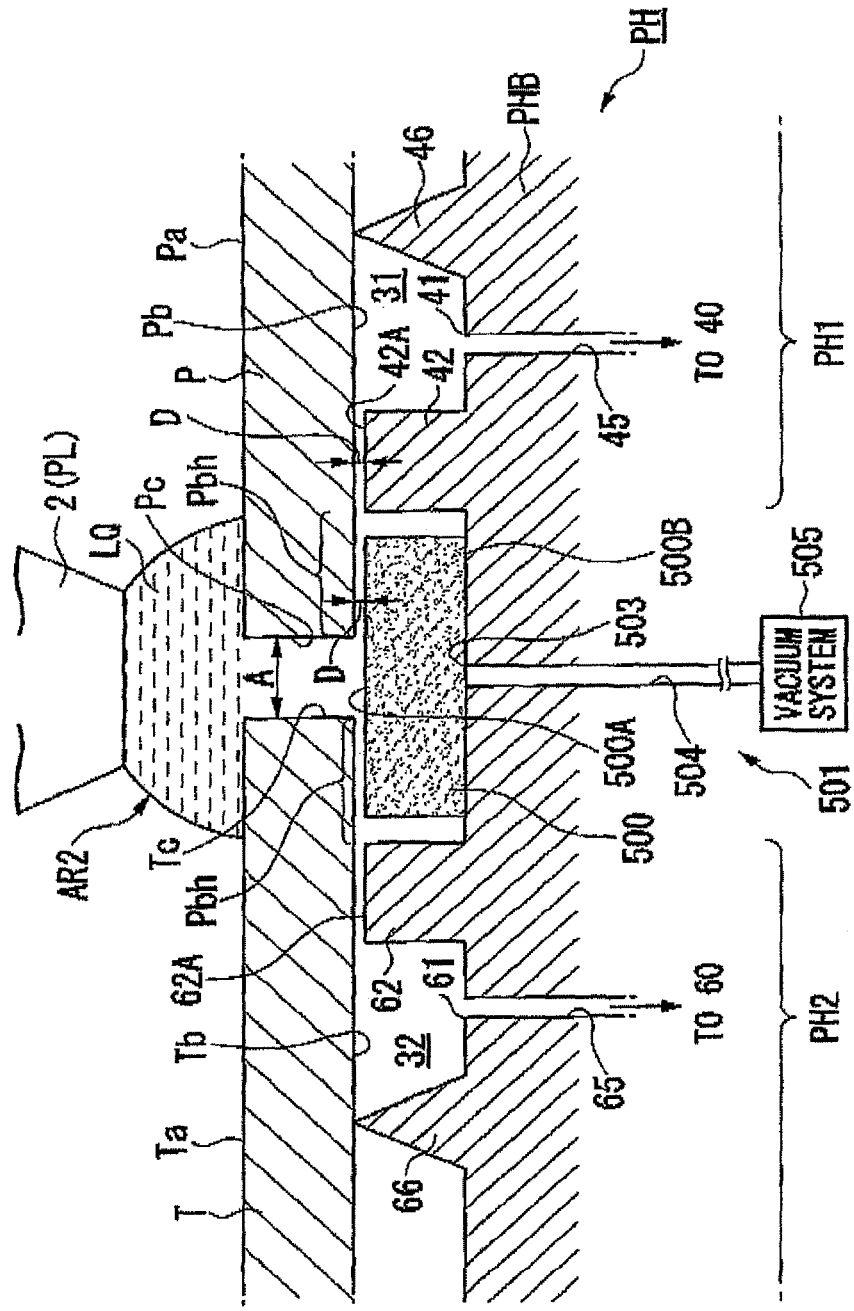
FIG. 12 is an enlarged sectional view of a main portion of a substrate holder of a sixth embodiment.

Next, a sixth embodiment of the present invention will be described referring to FIG. 12. In FIG. 12, on base member PHB and outside first peripheral wall portion 42 is provided porous member 500 that is capable of retaining liquid LQ. Porous member 500 is for retaining liquid LQ having penetrated from gap A. Between first peripheral wall portion 42 and second peripheral wall portion 62, porous member 500 is formed to be ring-shaped so as to surround the outside of first peripheral wall portion 42. Porous member 500 is disposed under gap A. Further, porous member 500 is formed widely so that it covers both of the region under substrate P's rear surface Pb's overhang region Pbh and the region under plate member T's rear surface Pb's overhang region Tbh. And, upper surface 500A of porous member 500 faces rear surface Pb (overhang region Pbh) of substrate P held by first holding portion PH1 and rear surface Tb (overhang region Tbh) of plate member T held by second holding portion PH2.

Further, substrate holder PH is provided with recovery mechanism 501 that suck-and-recovers liquid LQ held by porous member 500. Recovery mechanism 501 is provided with recovery port 503 formed in a predetermined position on base member PHB and between first peripheral wall portion 42 and second peripheral wall portion 62 and with vacuum system 505 that is connected to recovery port 503 via flow path 504. Recovery port 503 is provided in each of a plurality of predetermined positions on base member PHB and between first peripheral wall portion 42 and second peripheral wall portion 62. Rear surface 500B of porous member 500 is provided so as to be in contact with the base member PHB's portion which is located between first peripheral wall portion 42 and second peripheral wall portion 62 and on which recovery ports 503 are formed. When vacuum system 505 is activated, liquid LQ held by porous member 500 is suck-and-recovered toward vacuum system 505 via recovery ports 503, which are in contact with porous member 500, and is then stored into a predetermined tank. Since recovery ports 503 are formed on the base member PHB's upper surface portion, which is in contact with porous member 500, liquid LQ held by porous member 500 can be smoothly recovered. Further, midway along flow path 504 between recovery ports 503 and vacuum system 505 is provided a gas-liquid separator that separates liquid LQ recovered through recovery ports 503 from gas, and thus liquid LQ is prevented from flowing into vacuum system 505.

Since by, in this manner, disposing porous member 500 on a region that is located under gap A and outside gap D, liquid LQ having penetrated from gap A can be held by porous member 500, the disadvantage that liquid LQ having penetrated from gap A would get to the side of rear surface Pb of substrate P can be prevented.

It should be noted that, in this embodiment, liquid LQ held by porous member 500 is recovered by recovery mechanism 501, but it may also be configured such that porous member 500 is provided detachably (exchangeably) relative to base member PHB, and when porous member 500 has retained a predetermined amount of liquid LQ, the porous member is replaced by a new one.

Seventh Embodiment

Figure 13:
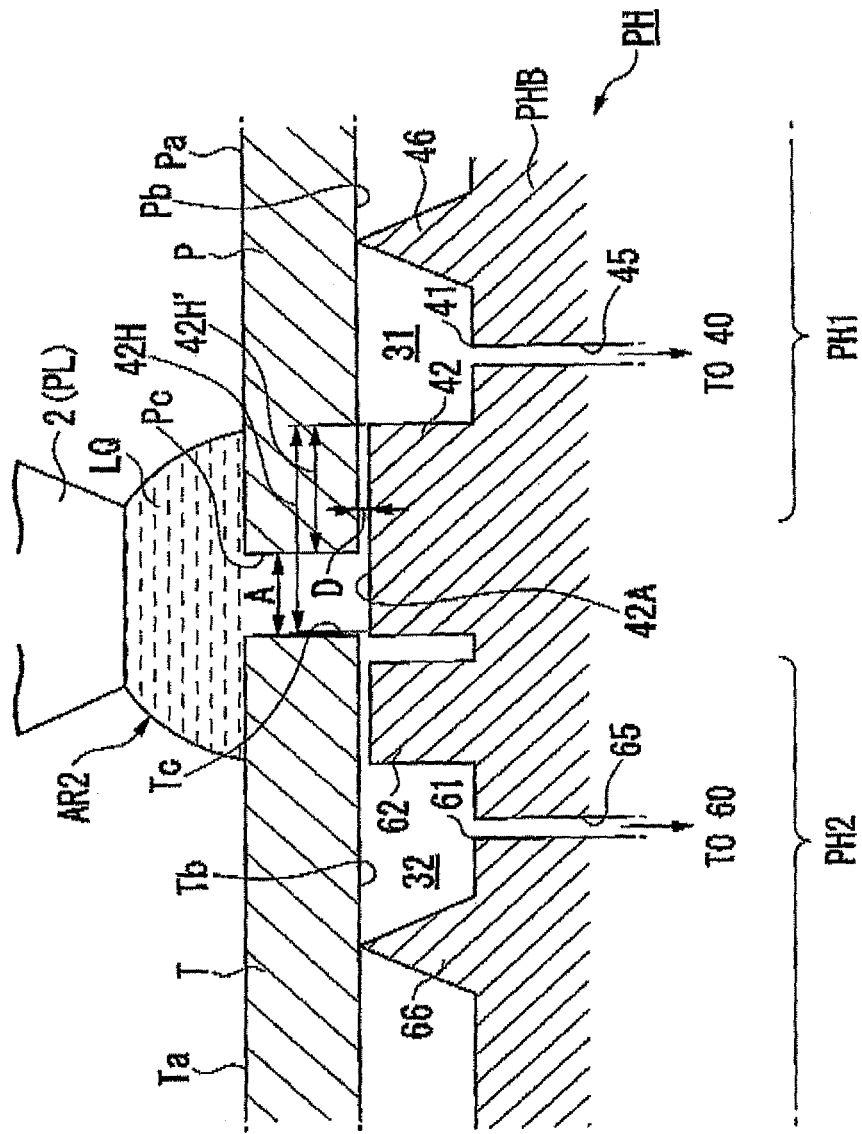
FIG. 13 is an enlarged sectional view of a main portion of a substrate holder of a seventh embodiment.

Next, a seventh embodiment of the present invention will be described referring to FIG. 13. In FIG. 13, a portion of upper surface 42A of first peripheral wall portion 42 faces rear surface Pb of substrate P, but the remaining portion thereof is disposed under gap A. In other words, in this embodiment, substrate P is not provided with any overhang portion, and first peripheral wall portion 42's upper surface 42A is formed such that its width (first peripheral wall portion's size in the radial direction) 42H is relatively large (wide).

Since, in this manner, by forming first peripheral wall portion 42's upper surface 42A widely, without providing any overhang portion, the largeness (length) 42H' where first peripheral wall portion 42's upper surface 42A faces substrate P's rear surface Pb is made large, liquid LQ having penetrated from gap A becomes hard to penetrate into first space 31 via gap D. Thus, the disadvantage that liquid LQ having penetrated from gap A would find its way over to the side of rear surface Pb of substrate P can be prevented.

Eighth Embodiment

Figure 14:
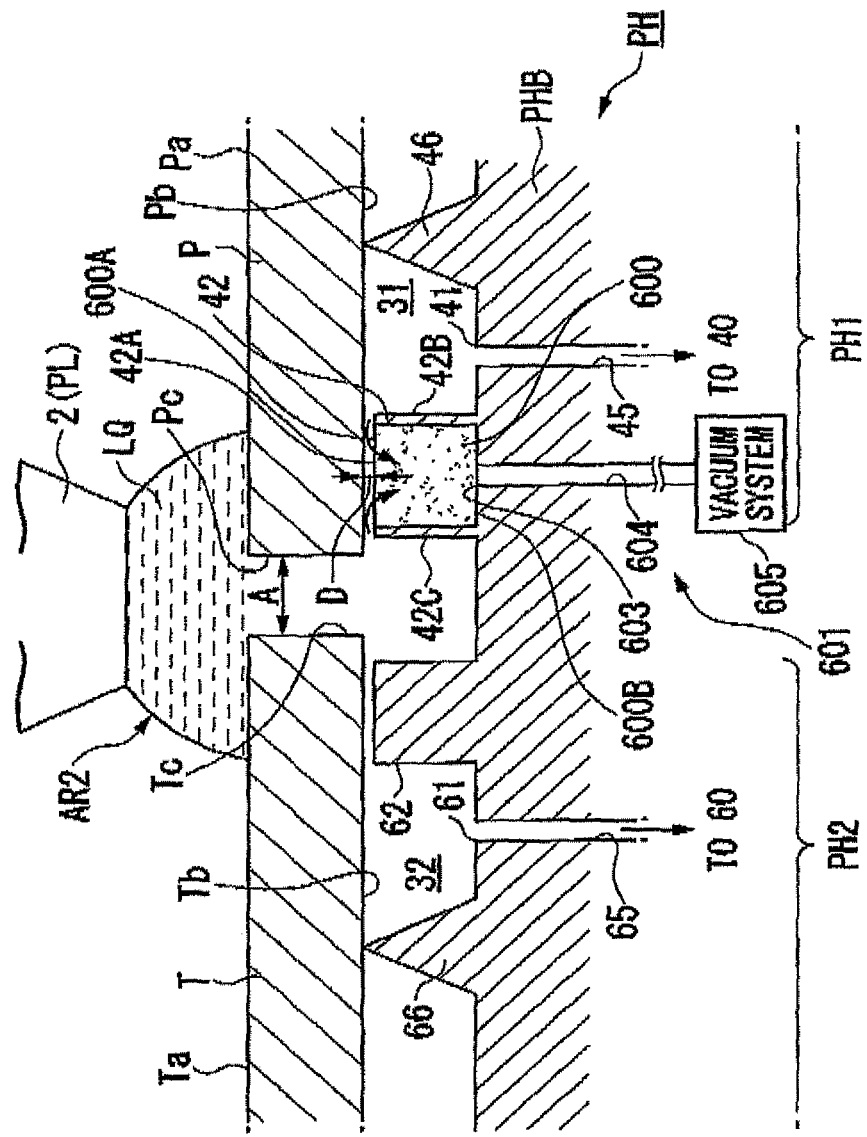
FIG. 14 is an enlarged sectional view of a main portion of a substrate holder of an eighth embodiment.

Next, an eighth embodiment of the present invention will be described referring to FIG. 14. In FIG. 14, at least a portion of the first peripheral wall portion 42 is formed by a porous body 600. In this embodiment, first peripheral wall portion 42 is constituted by the same material (e.g., a metal) as base member PHB and is provided with inside surface 42B provided on the side of first space 31 and with outside surface 42C provided so as to face second peripheral wall portion 62. Between inside surface 42B and outside surface 42C is provided porous body 600. Thus, in the embodiment, upper surface 42A is also formed by porous body 600. Since by forming at least a portion of the first peripheral wall portion 42 by porous body 600, even if liquid LQ has penetrated from gap A, the liquid LQ is retained by porous body 600, penetration of liquid LQ into the side of rear surface Pb of substrate P can be prevented.

Further, substrate holder PH is provided with recovery mechanism 601 that suck-and-recovers, via porous body 600, liquid LQ on porous body 600's surface, i.e., in the embodiment, upper surface 600A of porous body 600 forming upper surface 42A of first peripheral wall portion 42. Recovery mechanism 601 is provided with recovery port 603 formed in the base member PHB's portion with which rear surface 600B of porous body 600 is in contact and with vacuum system 605 that is connected to recovery port 603 via flow path 604. When vacuum system 605 is activated, liquid LQ on upper surface 600A of porous body 600 moves, in porous body 600, from upper surface 600A toward rear surface 600B and is then suck-and-recovered by vacuum system 605 via recovery port 603, which is in contact with rear surface 600B of porous body 600.

Since, in this manner, even if liquid LQ having penetrated from gap A becomes liable to pass through gap D, the liquid LQ is retained by porous body 600, and the liquid LQ on upper surface 600A of porous body 600 is further suck-and-recovered by vacuum system 605 via recovery port 603, penetration of liquid LQ into first space 31 can be prevented.

Ninth Embodiment

Figure 15:
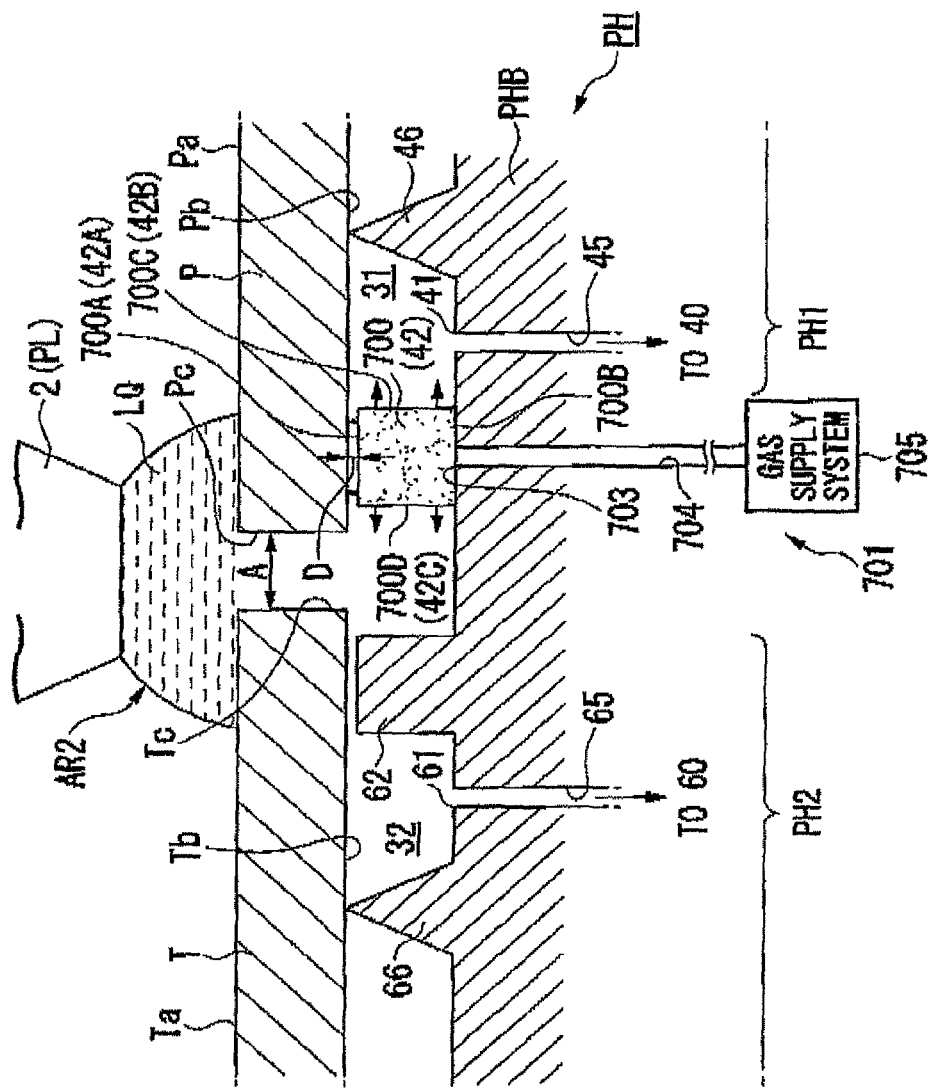
FIG. 15 is an enlarged sectional view of a main portion of a substrate holder of a ninth embodiment.

Next, a ninth embodiment of the present invention will be described referring to FIG. 15. In FIG. 15, first peripheral wall portion 42 is formed by porous body 700.

Further, substrate holder PH is provided with gas supply mechanism 701 that blows out a gas from the surface of porous body 700 via porous body 700. Gas supply mechanism 701 is provided with blowout port 703 formed in the base member PHB's portion with which rear surface 700B of porous body 700 is in contact and with gas supply system 705 that is connected to blowout port 703 via flow path 704. When gas supply system 705 is activated, the gas delivered from gas supply system 705 flows through flow path 704 and is then blown against rear surface 700B of porous body 700 via blowout port 703. The gas blown against rear surface 700B passes through the inside of porous body 700 and then blows out to the outside from porous body 700's upper surface 700A of (i.e., upper surface 42A of first peripheral wall portion 42), porous body 700's inside face 700C (i.e., inside face 42B of first peripheral wall portion 42), and porous body 700's outside face 700D (i.e., outside face 42C of first peripheral wall portion 42). Thus, even if liquid LQ having penetrated from gap A becomes liable to penetrate into first space 31 via gap D, penetration of liquid LQ into first space 31 can be blocked by the flow of the gas blowing out from upper surface 700A, outside face 700D, etc. of porous body 700.

It should be noted that it may also be configured such that to porous body 600 constituting first peripheral wall portion 42, as shown in FIG. 14, is connected gas supply mechanism 701, and a gas is blown out from upper surface 600A of porous body 600 or such that to porous body 700 constituting first peripheral wall portion 42, as shown in FIG. 15, is connected recovery mechanism 601, and liquid LQ on the surface of porous body 700, including each of upper surface 700A, inside face 700C, and outside face 700D, is recovered.

Tenth Embodiment

Figure 16:
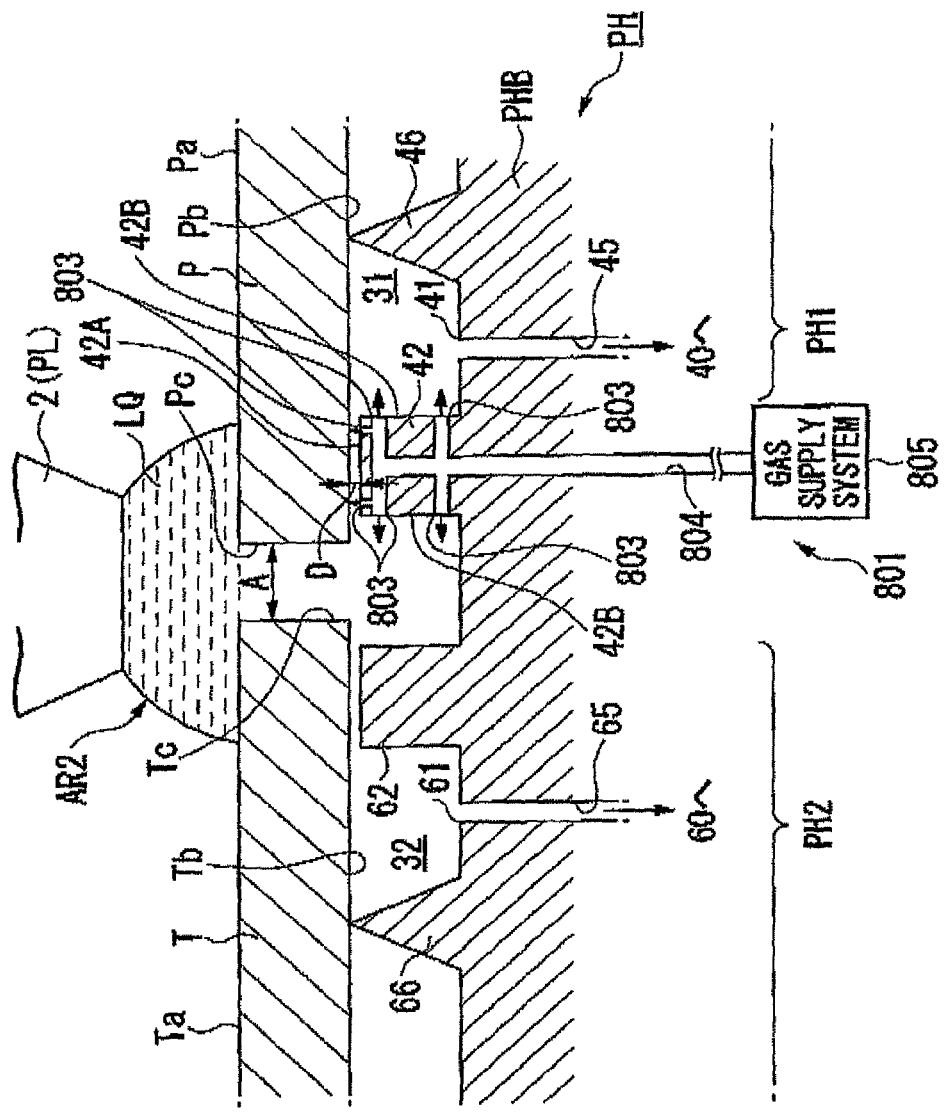
FIG. 16 is an enlarged sectional view of a main portion of a substrate holder of a tenth embodiment.

Next, a tenth embodiment of the present invention will be described referring to FIG. 16. In FIG. 16, in the surface of first peripheral wall portion 42 is provided blowout port 803 that blows out a gas. In the example shown in FIG. 16, blowout port 803 is provided in each of upper surface 42A, inside face 42B, and outside face 42C of first peripheral wall portion 42. To blowout ports 803 is connected gas supply system 805 via flow path 804. When gas supply system 805 is activated, the gas delivered from gas supply system 805 flows through flow path 804 and then blows out to the outside of first peripheral wall portion 42 via blowout ports 803. Thus, even if liquid LQ having penetrated from gap A becomes liable to penetrate into first space 31 via gap D, penetration of liquid LQ into first space 31 can be blocked by the flow of the gas blowing out from blowout ports 803.

Eleventh Embodiment

Figure 17:
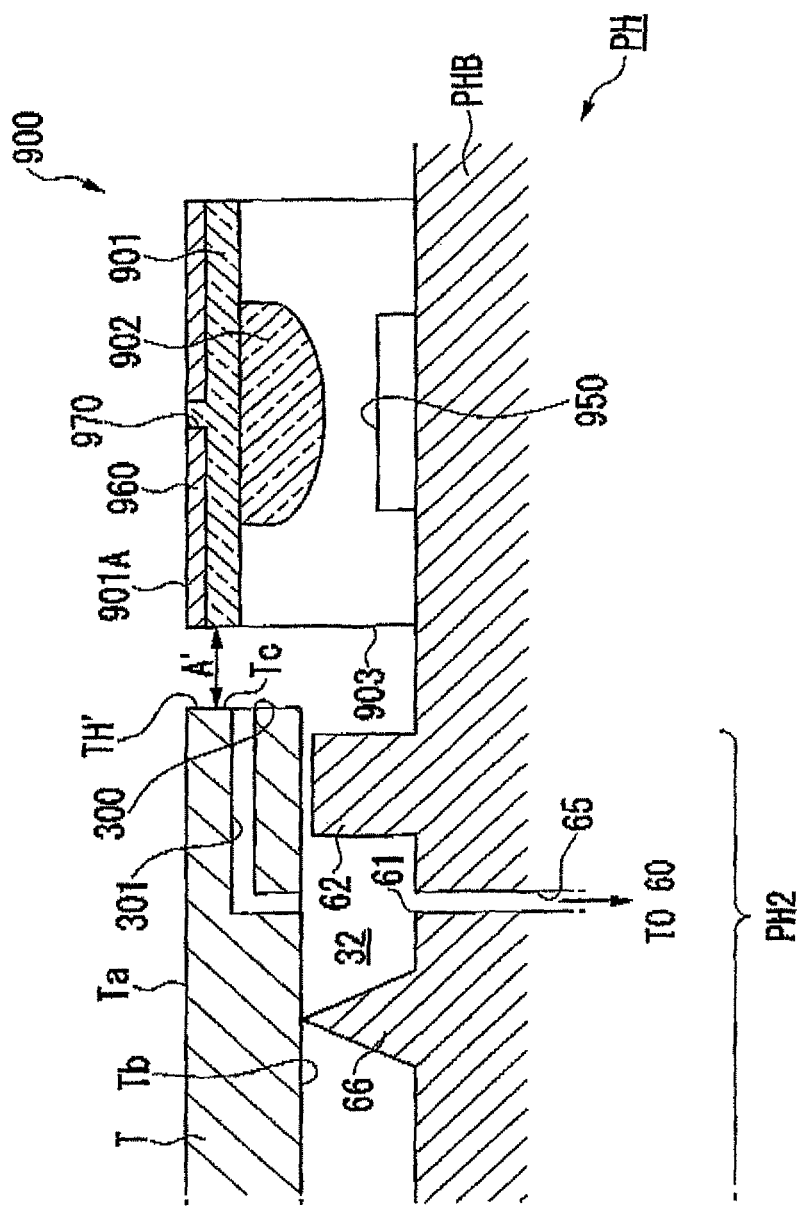
FIG. 17 is an enlarged sectional view of a main portion of a substrate holder of an eleventh embodiment.

In the above-described first to tenth embodiments, there has been described the case where liquid LQ having penetrated from gap A between plate member T and substrate P is handled, but there is, as shown in FIG. 17, the case where on substrate holder PH is provided, for example, light measurement portion 900 that measures the illumination condition of exposure light EL via projection optical system PL and liquid LQ. Light measurement portion 900 of FIG. 17 schematically shows such an illumination uniformity sensor as disclosed in, e.g., Japanese Unexamined Patent Application, Publication No. S57-117238 and is provided with upper plate 901 having a light transmissivity and optical element 902 provided beneath upper plate 901. On upper plate 901 is provided thin film 960 including a light-shielding material, e.g., chromium, and in a portion of thin film 960 is provided pinhole portion 970 through which the light can transmit. Upper plate 901 and optical element 902 are supported by supporting member 903 provided on base member PHB. Supporting member 903 has a continuous wall portion that surrounds upper plate 901 and optical element 902. Further, under optical element 902 is disposed light sensor 950 that receives the light (exposure light EL) having passed through pinhole portion 970. Light sensor 950 is disposed on base member PHB.

In a predetermined position of plate member T is formed hole portion TH' for disposing light measurement portion 900. Between upper plate 901 (supporting member 903) and plate member T is formed a predetermined gap A'. Further, upper surface 901A of upper plate 901 of light measurement portion 900 and surface Ta of plate member T held by second holding portion PH2 constitute substantially the same plane.

Further, on plate member T's side surface Tc that faces upper plate 901 is formed such a recovery port 300 as described in the above-described second embodiment. There is a possibility that when a light measurement using light measurement portion 900 is performed in the state in which projection area AR2 of liquid LQ is formed on upper plate 901, liquid LQ penetrates from gap A', but the liquid LQ having penetrated from gap A' can be recovered via recovery port 300. Of course, it may also be configured such that such an absorbing member 100 as in the above-described first embodiment is disposed on a region, located in the vicinity of gap A', of rear surface Tb of plate member T or such that such a liquid-repellent member (450) or a porous member (500) as described referring to FIG. 11 or FIG. 12 is provided so as to surround supporting member 903.

As described above, in the embodiments, liquid LQ is purified water. Purified water has the advantage that it is easily available in bulk in, e.g., semiconductor manufacturing factories and also the advantage that it does not adversely affect photoresist on substrate P, optical elements (lenses), etc. Further, purified water does not adversely affect the environment and contains scarcely any impurities; thus, the effect that it cleans the surface of substrate P and the surface of the optical element provided at the end portion of projection optical system PL can be expected. It should be noted that when the purity of the purified water supplied from, e.g., the factory, it may be configured such that the exposure apparatus itself has an ultrapure water system.

The refractive index n of purified water (water) relative to exposure light EL having a wavelength of about 193 nm is said to be approximately 1.44, and when ArF excimer laser light (having 193 nm wavelength) is used as the light source of exposure light EL, the wavelength is effectively shortened, on substrate P, as if multiplied by 1/n, i.e., effectively becomes approximately 134 nm, and thus, a high resolution can be obtained. Further, since the depth of focus increases by approximately n times, i.e., approximately by 1.44 times, compared with that in the air, when securing of the depth of focus on par with the depth of focus realized when the projection optical system is used in the air suffices, the numerical aperture of the projection optical system PL can be further increased; which also improves the resolution.

It is to be noted that when the liquid immersion method is used as described above, the numerical aperture NA of the projection optical system may become 0.9 to 1.3. When, in this manner, the numerical aperture NA of the projection optical system becomes large, a random-polarized light conventionally used as the exposure light may, because of its polarization effect, adversely affect the imaging performance; thus, a polarized light illumination method is preferably used. In that case, it is preferable that by performing linearly polarized light illumination in which the longitudinal direction of the line pattern of the line-and-space patterns on the mask (reticle) is aligned with the polarization direction, a lot of diffraction lights from S polarization components (TE polarization components), i.e., the diffraction lights from the polarization components having the polarization direction in line with the longitudinal direction of the line pattern are emitted from the pattern of the mask (reticle). When the space between projection optical system PL and the resist applied to the surface of substrate P is filled with the liquid, the transmittance at the resist surface of the diffraction lights from S polarization components (TE polarization components), which contribute to the improvement of the contrast, is higher compared with the case where the space between projection optical system PL and the resist applied to the surface of substrate P is filled with the gas (air), a high imaging performance can be obtained even in the case where the numerical aperture NA of the projection optical system is over 1.0. Further, a phase shift mask, an oblique incidence illumination method (in particular, a dipole illumination method), as disclosed in Japanese Unexamined Patent Application, Publication No. H06-188169, which meets the longitudinal direction of the line pattern, etc. may be appropriately combined with the above configuration, which works more effectively. In particular, a combination of a linearly polarized light illumination method and a dipole illumination method works effectively when the periodic direction of line-and-space patterns is limited to a predetermined single direction or when hole patterns are densely located along a predetermined direction. For example, assuming that, when a half-tone type phase shift mask having a transmittance of 6% (pattern having a half-pitch of about 45 nm) is illuminated by using a combination of a linearly polarized light illumination method and a dipole illumination method, illumination $\sigma$ defined by the circumscribing circle of the two light beams forming the dipole in the pupil plane is 0.95, that the radius of each of the light beams in the pupil plane is $0.125\sigma$, and that the numerical aperture NA of projection optical system PL is 1.2, the depth of focus (DOF) can be increased by about 150 nm compared with that when a random-polarized light is used.

Further, a combination of a linearly polarized light illumination method and a small $\sigma$ illumination method (in which the $\sigma$ value defined by the ratio of the illumination system's numerical aperture NAi and the projection optical system's numerical aperture Nap becomes less than 0.4) also effectively works.

It should be noted that, for example, when by using, for example, ArF excimer laser light as the exposure light and using projection optical system PL having a reduction magnification of about ¼, a fine line-and-space pattern (e.g., line-and-space of about 25 to 50 nm) is exposed onto substrate P, depending on the structure of mask M (e.g., the fineness of the pattern or the thickness of chrome), mask M acts as a polarization plate due to the Wave Guide effect, and the emitted amount of the diffraction lights from S polarization components (TE polarization components) becomes larger than the emitted amount of the diffraction lights from P polarization components (TM polarization components), which lower the contrast. In this case, the above-described linearly polarized light illumination is preferably employed, but even when mask M is illuminated with a random-polarized light, a high resolution performance can be obtained even in the case where the numerical aperture NA of the projection optical system PL is 0.9 to 1.3.

Further, although, for example, when a very fine line-and-space pattern on mask M is exposed onto substrate P, there is the possibility that the emitted amount of the diffraction lights from P polarization components (TM polarization components) becomes larger than the emitted amount of the diffraction lights from S polarization components (TE polarization components) due to the Wire Grid effect, since, for example, when by using, for example, an ArF excimer laser light as the exposure light and using projection optical system PL having a reduction magnification of about ¼, a line-and-space pattern of more than 25 nm is exposed onto substrate P, the emitted amount of the diffraction lights from S polarization components (TE polarization components) is larger than the emitted amount of the diffraction lights from P polarization components (TM polarization components), a high resolution performance can be obtained even in the case where the numerical aperture NA of the projection optical system is 0.9 to 1.3.

Further, not only the linearly polarized light illumination, in which the longitudinal direction of the line pattern on the mask (reticle) is aligned with the polarization direction, but also the combination, as disclosed in Japanese Unexamined Patent Application, Publication No. H06-53120, of a polarized light illumination method in which the lights used are linearly polarized in the tangential directions relative to a circle of which center is the optical axis and an oblique incidence illumination method is effective. In particular, in a case where the pattern of the mask (reticle) includes not only line patterns which extend in a predetermined single direction but also line patterns which extends in multiple different directions (a case where line-and-space patterns having different periodic directions exist mixedly), by using, as also disclosed in Japanese Unexamined Patent Application, Publication No. H06-53120, a polarized light illumination method in which the lights used are linearly polarized in the tangential directions relative to a circle of which center is the optical axis in combination with an annular illumination method, a high resolution performance can be obtained even in the case where the numerical aperture NA of the projection optical system is large. For example, assuming that, when a half-tone type phase shift mask having a transmittance of 6% (pattern having a half-pitch of about 63 nm) is illuminated by using a combination of a polarized light illumination method in which the lights used are linearly polarized in the tangential directions relative to a circle of which center is the optical axis and an annular illumination method (having an annular ratio of 3 to 4), the illumination $\sigma$ is 0.95 and that the numerical aperture NA of projection optical system PL is 1.00, the depth of focus (DOF) can be increased by about 250 nm compared with that when a random-polarized light is used, and, when assuming that a pattern having a half-pitch of about 55 nm is illuminated and the numerical aperture NA of projection optical system PL is 1.2, the depth of focus can be increased by about 100 nm.

Further, in addition to the above-described various kinds of illumination methods, it is also effective to apply a progressive focus exposure method, as disclosed in, e.g., Japanese Unexamined Patent Application, Publication No. H04-277612 or Japanese Unexamined Patent Application, Publication No. 2001-345245, or a multi-wavelength exposure method in which by using an exposure light of multiple wavelengths (e.g., two wavelengths), an effect equivalent to that of the progressive focus exposure method is obtained.

In the embodiments, optical element 2 is attached to the end of projection optical system PL, and by this lens, the optical characteristics of projection optical system PL (spherical aberration, coma aberration, etc.) can be adjusted. It should be noted that as the optical element to be attached to the end of projection optical system PL, an optical plate used for the adjustment of the optical characteristics of projection optical system PL may be utilized. Alternatively, a plane parallel plate that can transmit exposure light EL may be utilized.

It should be noted that if the pressure, caused by the flow of liquid LQ, of the space between the optical element located at the end of projection optical system PL and substrate P is high, it may be configured such that the optical element is rigidly fixed so as not to move due to the pressure, instead of making the optical element replaceable.

It should be noted that while, in the embodiments, it is configured such that the space between projection optical system PL and the surface of substrate P is filled with liquid LQ, it may also be configured, for example, such that the space is filled with liquid LQ in the condition that a cover glass constituted by a plane parallel plate is attached to the surface of substrate P.

It should be noted that while, in the embodiments, liquid LQ is water (purified water), liquid LQ may be a liquid other than water. For example, when the light source of exposure light EL is an $F_2$ laser, the $F_2$ laser light does not transmit through water, and thus, as liquid LQ, a fluorofluid that can transmit the $F_2$ laser light, such as perfluoropolyether (PFPE) or fluorochemical oil, may be used. In this case, the portions that come into contact with liquid LQ are applied with lyophilic treatment, by forming a thin film of a substance which includes, e.g., fluorine and has a molecular structure of a small polarity. Further, as liquid LQ, a material (e.g., cedar oil) that can transmit exposure light EL, has a high refractive index as high as practicable, and does not affect projection optical system PL and the photoresist applied to the surface of substrate P can also be used. Also in this case, the surface treatment is applied in accordance with the polarity of liquid LQ to be used.

It is to noted that regarding substrate P of each of the above-described embodiments, not only a semiconductor wafer for manufacturing a semiconductor device, but also a glass substrate for a display device, a ceramic wafer for a thin film magnetic head, a master mask or reticle (synthetic quartz or silicon wafer), etc. can be used.

Regarding exposure apparatus EX, in addition to a scan type exposure apparatus (scanning stepper) in which while synchronously moving mask M and substrate P, the pattern of mask M is scan-exposed, a step-and-repeat type projection exposure apparatus (stepper) in which the pattern of mask M is exposed at one time in the condition that mask M and substrate P are stationary, and substrate P is successively moved stepwise can be used.

Further, regarding exposure apparatus EX, the present invention can be applied to an exposure apparatus in which in the state that a first pattern and substrate P are substantially stationary, the reduction image of the first pattern is exposed at one time by using a projection optical system (e.g., a refraction type projection optical system that has a reduction magnification of ⅛ and includes no reflecting element). In this case, the present invention can be applied to a stitch type one-shot exposure apparatus in which thereafter, in the state that a second pattern and substrate P are substantially stationary, the reduction image of the second pattern is exposed at one time onto substrate P by using the projection optical system in a manner that the first pattern image and the second pattern image partially overlap with each other. Further, in conjunction with the stitch type exposure apparatus, the present invention can also be applied to a step-and-stitch type exposure apparatus in which at least two patterns are transferred onto substrate P in a partially overlapping manner, and substrate P is successively moved.

Further, the present invention can also be applied to a twin-stage type exposure apparatus which is disclosed in, e.g., Japanese Unexamined Patent Application, Publication No. H10-163099, Japanese Unexamined Patent Application, Publication No. H10-214783, and Published Japanese Translation No. 2000-505958 of the PCT International Publication.

Further, the present invention can also be applied to an exposure apparatus provided with a substrate stage and a measurement stage, as disclosed in Japanese Unexamined Patent Application, Publication No. H11-135400.

Regarding the type of exposure apparatus EX, the present invention is not limited to an exposure apparatus, which exposes a semiconductor pattern onto substrate P, for manufacturing semiconductor devices, but can also be applied to a variety of exposure apparatuses, e.g., an exposure apparatus for manufacturing liquid crystal display devices or a displays, an exposure apparatus for manufacturing thin film magnetic heads, an exposure apparatus for manufacturing image pickup devices (CCDs), and an exposure apparatus for manufacturing reticles or masks.

When using a linear motor (see U.S. Pat. No. 5,623,853 or U.S. Pat. No. 5,528,118) in substrate stage PST or mask stage MST, either air-cushion type linear motor using an air bearing or a magnetic levitation type linear motor using a Lorentz force or reactance force may be used. Further, substrate stage PST may be either of a type moving along a guide or of a guideless type having no guide. Further, each of stages PST and MST may be either of a type moving along a guide or of a guideless type having no guide.

As the driving mechanism for each of stages PST and MST, a planar motor in which by making a magnet unit in which magnets are two-dimensionally arranged and an armature unit in which coils are two-dimensionally arranged face each other, each of PST and MST is driven by an electromagnetic force may be used. In this case, either one of the magnet unit and the armature unit is attached to stage PST or stage MST, and the other unit is attached to the moving surface side of stage PST or stage MST.

A reaction force generated by the movement of substrate stage PST may be, as described in Japanese Unexamined Patent Application, Publication No. H08-166475 (U.S. Pat. No. 5,528,118), mechanically released to the floor (earth) by use of a frame member so that the force does not transmit to projection optical system PL.

A reaction force generated by the movement of mask stage MST may be, as described in Japanese Unexamined Patent Application, Publication No. H08-330224 (corresponding to U.S. Pat. No. 5,874,820), mechanically released to the floor (earth) by use of a frame member so that the force does not transmit to projection optical system PL.

Exposure apparatus EX according to the embodiments of the present application is built by assembling various subsystems, including each element listed in the claims of the present application, in such a manner that prescribed mechanical accuracy, electrical accuracy, and optical accuracy are maintained. In order to ensure the various accuracies, prior to and after the assembly, every optical system is adjusted to achieve its optical accuracy, every mechanical system is adjusted to achieve its mechanical accuracy, and every electrical system is adjusted to achieve its electrical accuracy. The process of assembling each subsystem into the exposure apparatus includes mechanical interfaces, electrical circuit wiring connections, and air pressure plumbing connections between each subsystem. Needless to say, there is also a process where each subsystem is assembled prior to the assembling of the exposure apparatus from the various subsystems. On completion of the process of assembling the various subsystems in the exposure apparatus, overall adjustment is performed to make sure that every accuracy is maintained in the complete exposure apparatus. Additionally, it is desirable to manufacture the exposure apparatus in a clean room, in which the temperature, purity, etc. are controlled.

Figure 18:
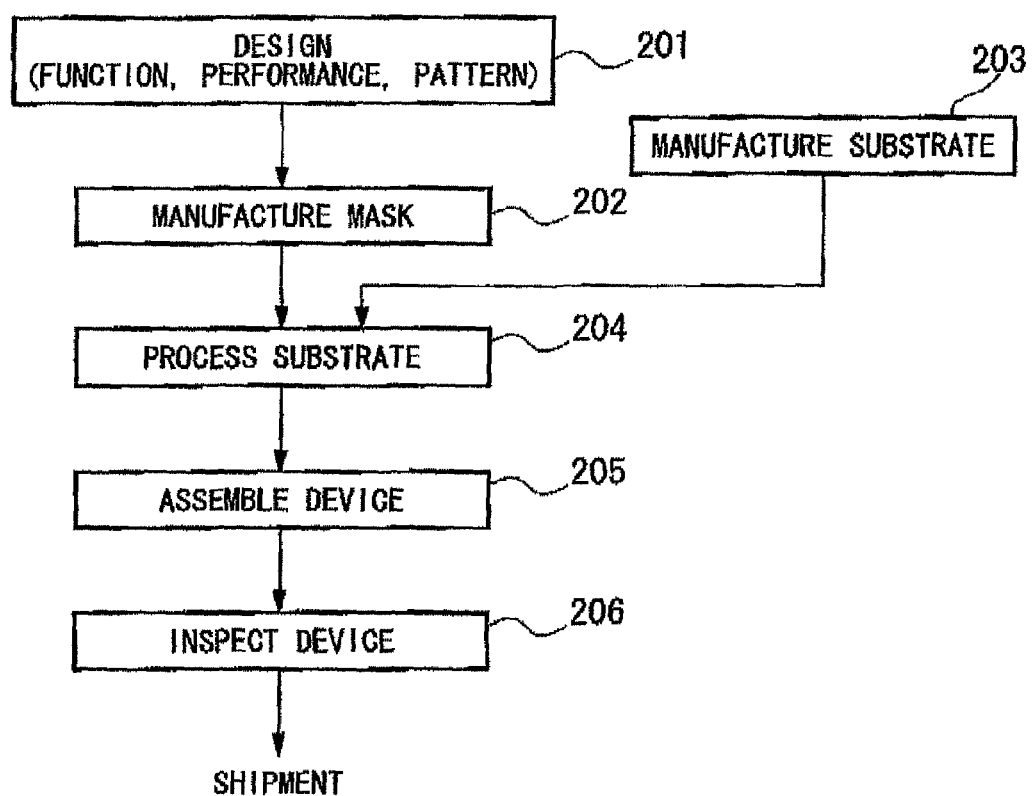
FIG. 18 is a flowchart showing an example of a semiconductor-device manufacturing process.
Figure 19:
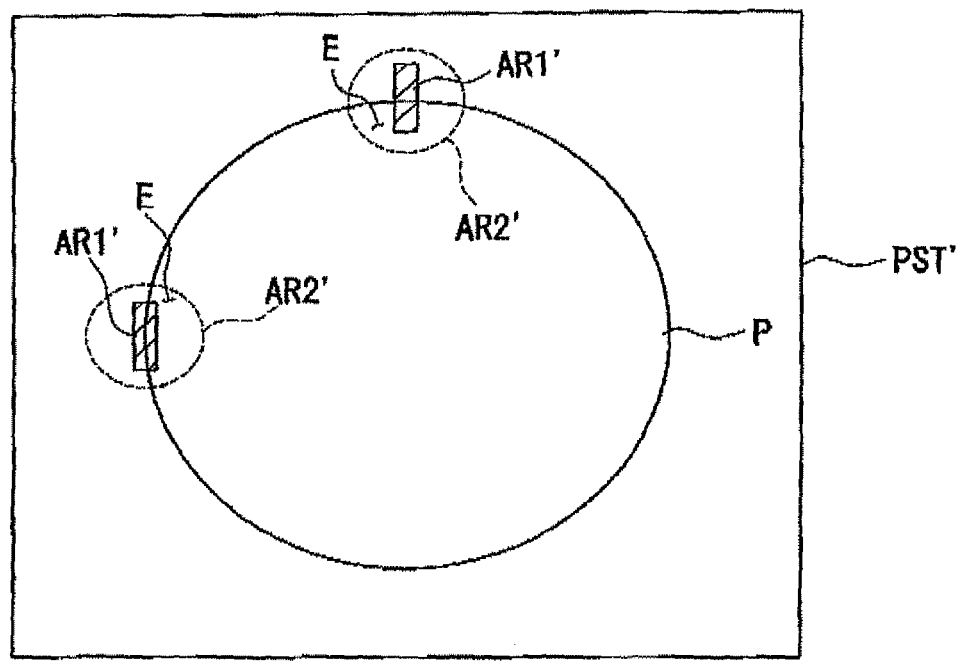
FIG. 19 is a schematic for explaining problems of prior art.

As shown in FIG. 18, micro devices such as semiconductor devices are manufactured by a series of steps, including: step 201 in which the micro device's function and performance design is performed; step 202 in which a mask (reticle) is manufactured based on the design step; step 203 in which a substrate, the device's base material, is manufactured; substrate processing step 204 including a process in which the mask pattern is exposed onto the substrate by exposure apparatus EX according to the above-described embodiments; device assembly step 205 (including a dicing process, a bonding process, and a packaging process); inspection step 206.

What is claimed is:

1. An exposure apparatus that exposes a substrate via a projection optical system and via a liquid immersion region, which is formed with a liquid supplied below the projection optical system, the exposure apparatus comprising:
a stage that is capable of moving relative to the projection optical system, wherein the stage comprises:
a supporting portion that comprises a plurality of supports supporting a rear surface of the substrate;
a porous member located at a level lower than a gap formed by the substrate supported by the supporting portion and an upper surface of the stage, the upper surface being located around the supporting portion, the porous member being configured to keep the liquid from the gap;
a recovery portion having a recovery port located below the porous member that recovers the liquid from the porous member via the recovery port;
a first peripheral wall portion that is provided to surround the supporting portion and that is provided so that the rear surface of the substrate supported by the supporting portion faces the first peripheral wall portion; and
a suction port facing a space surrounded by the first peripheral wall portion and configured to suck gas in the space,
wherein the porous member is disposed outside the first peripheral wall portion, and
wherein at least a part of the porous member is located directly below an overhang region of the substrate supported by the supporting portion, the overhang region overhanging the first peripheral wall portion.

2. The exposure apparatus according to claim 1, wherein the recovery portion comprises:
a flow path having one end portion that is connected with the recovery port, and having another end portion that is configured to connect with a suction device, wherein the recovery port is arranged to face the porous member.

3. The exposure apparatus according to claim 2, wherein the recovery port is provided to contact with the porous member.

4. The exposure apparatus according to claim 2, wherein the recovery portion comprises a separator that is provided in the flow path and that separates the liquid and a gas recovered from the recovery port.

5. The exposure apparatus according to claim 1, wherein the porous member is disposed outside the supporting portion.

6. The exposure apparatus according to claim 1, wherein the stage comprises a second peripheral wall portion that is provided below the upper surface of the stage to surround the first peripheral wall portion, and
the porous member is located between the first peripheral wall portion and the second peripheral wall portion.

7. The exposure apparatus according to claim 1, wherein at least a part of the porous member is located directly below the gap.

8. The exposure apparatus according to claim 1, wherein
the stage comprises a plate member that is provided so that the substrate supported by the supporting portion is surrounded by the plate member,
the upper surface of the stage is an upper surface of the plate member, and
the porous member is provided on a rear surface of the plate member.

9. The exposure apparatus according to claim 8, wherein at least a part of the porous member is provided at a peripheral area of the rear surface of the plate member, near the gap.

10. The exposure apparatus according to claim 1, wherein the porous member is disposed to surround the supporting portion.

11. The exposure apparatus according to claim 1, wherein the porous member is provided to be attachable and detachable with respect to the stage.

12. The exposure apparatus according to claim 1, wherein an upper surface of the substrate held by the supporting portion and the upper surface of the stage constitute substantially the same plane.

13. A method of manufacturing a device on a photosensitive substrate, comprising:
exposing the photosensitive substrate using the exposure apparatus according to claim 1, and developing the photosensitive substrate which has been exposed.

14. A substrate stage that holds a substrate that is exposed via a projection optical system and a liquid immersion region formed with a liquid supplied below the projection optical system, and moves the substrate relative to the projection optical system, the substrate stage comprising:
a supporting portion that comprises a plurality of supports supporting a rear surface of the substrate,
a porous member located at a level lower than a gap formed by the substrate supported by the supporting portion and an upper surface of the substrate stage and being configured to keep the liquid from the gap, the upper surface being located around the supporting portion,
a recovery portion having a recovery port located below the porous member that recovers the liquid from the porous member via the recovery port,
a first peripheral wall portion that is provided to surround the supporting portion and that is provided so that the rear surface of the substrate supported by the supporting portion faces the first peripheral wall portion, and
a suction port facing a space surrounded by the first peripheral wall portion and configured to suck gas in the space,
wherein the porous member is disposed outside the first peripheral wall portion, and
wherein at least a part of the porous member is located directly below an overhang region of the substrate supported by the supporting portion, the overhang region overhanging the first peripheral wall portion.

15. The substrate stage according to claim 14, wherein the porous member is provided to surround the supporting portion.

16. The substrate stage according to claim 14, wherein the porous member is disposed outside the supporting portion.

17. The substrate stage according to claim 14, wherein the porous member is provided in a space, which is formed outside the supporting portion and below the gap.

* * * * *